(12) United States Patent
Seo et al.

(10) Patent No.: US 9,928,892 B2
(45) Date of Patent: Mar. 27, 2018

(54) MEMORY APPARATUSES HAVING GROUND SWITCHES

(71) Applicants: Bo-young Seo, Suwon-si (KR); Yong-seok Chung, Seoul (KR); Gwan-hyeob Koh, Seoul (KR); Yong-kyu Lee, Gwacheon-si (KR)

(72) Inventors: Bo-young Seo, Suwon-si (KR); Yong-seok Chung, Seoul (KR); Gwan-hyeob Koh, Seoul (KR); Yong-kyu Lee, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 21 days.

(21) Appl. No.: 15/153,866

(22) Filed: May 13, 2016

(65) Prior Publication Data

US 2017/0053688 A1 Feb. 23, 2017

(30) Foreign Application Priority Data

Aug. 20, 2015 (KR) .................. 10-2015-0117336

(51) Int. Cl.
| | |
|---|---|
| *G11C 11/00* | (2006.01) |
| *G11C 11/16* | (2006.01) |
| *H01L 43/08* | (2006.01) |
| *H01L 27/22* | (2006.01) |

(52) U.S. Cl.
CPC ........ *G11C 11/1675* (2013.01); *G11C 11/161* (2013.01); *G11C 11/1655* (2013.01); *G11C 11/1657* (2013.01); *G11C 11/1659* (2013.01); *G11C 11/1673* (2013.01); *H01L 27/228* (2013.01); *H01L 43/08* (2013.01)

(58) Field of Classification Search
CPC ............ G11C 11/1675; G11C 11/1657; G11C 11/1659; G11C 11/1673; G11C 11/1655; G11C 11/161; H01L 27/228; H01L 43/08
See application file for complete search history.

(56) References Cited

U.S. PATENT DOCUMENTS

| | | | |
|---|---|---|---|
| 6,069,824 | A | 5/2000 | Kojima et al. |
| 6,985,376 | B2 | 1/2006 | Matsuoka |
| 7,405,965 | B2 | 7/2008 | Choi et al. |
| 7,633,100 | B2 | 12/2009 | Cho et al. |
| 7,668,001 | B2 | 2/2010 | Tajiri et al. |
| 8,102,729 | B2 | 1/2012 | Lee et al. |
| 8,295,076 | B2 | 10/2012 | Jeon et al. |
| 8,923,040 | B2 | 12/2014 | Lin et al. |
| 2013/0215660 | A1 | 8/2013 | Hwang |
| 2014/0092665 | A1 | 4/2014 | Ueda et al. |

*Primary Examiner* — Mohammed A Bashar
(74) *Attorney, Agent, or Firm* — Harness, Dickey & Pierce, P.L.C.

(57) ABSTRACT

A resistive memory apparatus includes a memory cell array having a plurality of memory cells and a first ground switch. The plurality of memory cells are arranged in a plurality of rows and a plurality of columns, and each memory cell in a first column of the plurality of memory cells is connected between a first bitline and a first source line. The first ground switch is connected in parallel with the first source line, and the first ground switch is configured to selectively provide a first current path from the first bitline to ground through a selected memory cell in the first column of the plurality of memory cells and the first source line, the current path traversing only a portion of the first source line.

9 Claims, 27 Drawing Sheets

MEMORY APPARATUSES HAVING GROUND SWITCHES

CROSS-REFERENCE TO RELATED APPLICATION

This application claims priority to Korean Patent Application No. 10-2015-0117336, filed on Aug. 20, 2015, in the Korean Intellectual Property Office, the disclosure of which is incorporated herein in its entirety by reference.

BACKGROUND

Field

One or more example embodiments of inventive concepts relate to semiconductor memory apparatuses, for example, to memory apparatuses that include a ground switch in a memory cell array to reduce a resistance distribution error of memory cells, which occurs due to a line resistance difference.

Description of Related Art

Among resistive memory apparatuses, magnetic random-access memory (MRAM) allows for relatively fast write operations and read operations, has non-volatile characteristics and relatively low power consumption. As a result, MRAM is mainly used as a data storage device. MRAM stores data in a magneto-resistance element of a memory cell. However, as capacity of MRAMs increase, a cell resistance distribution error may occur due to a difference in line resistances according to positions of memory cells.

SUMMARY

One or more example embodiments of inventive concepts provide semiconductor memory apparatuses having ground switches in memory cell arrays to reduce a resistance distribution error of memory cells.

At least one example embodiment provides a memory apparatus comprising: a plurality of memory cells arrayed in a plurality of rows and a plurality of columns, each of the plurality of memory cells including a cell transistor and a memory element; a plurality of bitlines, each of the plurality of bitlines being connected to memory elements of memory cells in a corresponding column of memory cells; a plurality of source lines, each of the plurality of source lines being connected to sources of cell transistors of memory cells in a corresponding column of memory cells; at least one first ground switch including a first transistor connected between a first ground line and a source of a cell transistor of a first memory cell from among memory cells in a first of the plurality of columns, a gate of the first transistor being connected to a first of the plurality of bitlines; and at least one second ground switch including a second transistor connected between a second ground line and the first of the plurality of bitlines, a gate of the second transistor being connected to a first of the plurality of source lines.

The memory apparatus may further include: a plurality of wordlines, each of the plurality of wordlines corresponding to a row among the plurality of rows of memory cells, and each of the plurality of wordlines being connected to gates of cell transistors of memory cells in the corresponding row of memory cells.

The at least one first ground switch may further comprise: a third transistor adjacent to the first transistor, the third transistor and the first transistor being commonly connected to the first ground line; wherein the third transistor is connected between the first ground line and a source of a cell transistor of a second memory cell from among the memory cells in the first of the plurality of columns, and a gate of the third transistor is connected to the first of the plurality of bitlines. Sources of the first and third transistors connected to the first ground line may be impurity regions separated by an isolation region. Alternatively, sources of the first and third transistors connected to the first ground line may be formed as one impurity region.

A width of the gates of each of the first and third transistors may be the same or substantially the same as a width of a gate of the cell transistor of at least one of the first and second memory cells. A length of the gates of each of the first and third transistors may be the same or substantially the same as a length of the gate of the cell transistor of at least one of the first and second memory cells.

The at least one second ground switch may further comprise: a third transistor adjacent to the second transistor, the third transistor and the second transistor being commonly connected to the second ground line; wherein the third transistor is connected between the second ground line and the first of the plurality of bitlines, and a gate of the third transistor is connected to the first of the plurality of source lines. Sources of the second and third transistors connected to the second ground line may be impurity regions separated by an isolation region. Alternatively, sources of the second and third transistors connected to the second ground line may be formed as one impurity region.

A width of the gates of each of the second and third transistors may be the same or substantially the same as a width of a gate of the cell transistor of the first memory cell. A length of the gates of each of the second and third transistors may be the same or substantially the same as a length of the gate of the cell transistor of the first memory cell.

The memory apparatus may further comprise: a plurality of complementary bitlines, each of the plurality of complementary bitlines being paired with a corresponding one of the plurality of bitlines; a second memory cell corresponding to the first memory cell, the second memory cell being connected to a first of the plurality of complementary bitlines, the first of the plurality of complementary bitlines corresponding to the first of the plurality of bitlines; and wherein the at least one first ground switch further includes a third transistor connected between the first ground line and a source of a cell transistor of the second memory cell. A gate of the third transistor may be connected to the first of the plurality of complementary bitlines.

The at least one second ground switch may further comprise: a fourth transistor connected between the second ground line and the first of the plurality of complementary bitlines; wherein a gate of the fourth transistor is connected to the first of the plurality of source lines. The first ground line and the second ground line may be a common ground line.

The memory element may include a magnetic tunnel junction (MTJ) having a magnetoresistive element.

At least one other example embodiment provides a memory apparatus comprising: a plurality of memory cells arrayed in a plurality of rows and a plurality of columns, each of the plurality of memory cells including a cell transistor and a memory element; a plurality of bitlines, each of the plurality of bitlines being connected to memory elements of memory cells in a corresponding column of memory cells; a plurality of source lines, each of the plurality of source lines being connected to sources of cell transistors of memory cells in a corresponding column of memory cells; at least one first ground switch including a first transistor connected between a first line and a source of a cell transistor of a first memory cell from among memory cells in a first of the plurality of columns, a gate of the first transistor being connected to a first of the plurality of bitlines, and the first line being configured to receive a voltage applied to a first of the plurality of source lines; and at least one second ground switch including a second transistor connected between each of the plurality of bitlines and a second line, a gate of the second transistor being connected to the first of the plurality of source lines, and the second line being configured to receive a voltage applied to the first of the plurality of bitlines.

The at least one first ground switch may further comprise: a third transistor adjacent to the first transistor, the third transistor and the first transistor being commonly connected to the first line; wherein the third transistor is connected between the first line and a source of a cell transistor of a second memory cell from among the memory cells in the first of the plurality of columns, and a gate of the third transistor is connected to the first of the plurality of bitlines.

The at least one second ground switch may further comprise: a third transistor adjacent to the second transistor, the third transistor and second transistor being commonly connected to the second line; wherein the third transistor is connected between the second line and the first of the plurality of bitlines, and a gate of the third transistor is connected to the first of the plurality of source lines.

The memory apparatus may further comprise: a plurality of complementary bitlines, each of the plurality of complementary bitlines paired with a corresponding one of the plurality of bitlines; and a second memory cell corresponding to the first memory cell, the second memory cell being connected to a first of the plurality of complementary bitlines, the first of the plurality of complementary bitlines corresponding to the first of the plurality of bitlines; wherein the at least one first ground switch further includes a third transistor connected between the first line and a source of a cell transistor of the second memory cell. A gate of the third transistor may be connected to the first of the plurality of complementary bitlines.

The at least one second ground switch may further comprise: a fourth transistor connected between the second line and the first of the plurality of complementary bitlines; wherein a gate of the fourth transistor is connected to the first of the plurality of source lines.

The memory apparatus may further include an input/output (I/O) circuit configured to apply a first voltage to the first line, the first voltage being a voltage applied to the first of the plurality of source lines, the I/O circuit being further configured to apply a second voltage to the second line, the second voltage being a voltage applied to the first of the plurality of bitlines.

At least one other example embodiment provides a memory cell array comprising: a plurality of memory cells arranged in a plurality of rows and a plurality of columns, each memory cell in a first of the plurality of columns being connected between a first bitline and a first source line; and a first switch circuit connected in parallel with the first source line, the first switch circuit configured to selectively provide a first current path from the first bitline to a first line through (i) a selected memory cell in the first of the plurality of columns and (ii) the first source line; wherein the first current path traverses only a portion of the first source line, and the first line is connected to one of ground and a voltage source.

The memory cell array may further comprise: a second switch circuit connected in parallel with the first bitline, the second switch circuit configured to selectively provide a second current path from the first source line to a second line through the selected memory cell and the first bitline; wherein the second current path traverses only a portion of the first bitline.

The first switch circuit may be further configured to selectively provide the first current path based on a voltage applied to the first bitline. The voltage may be one of a read voltage and a write voltage applied to the selected memory cell. The first switch circuit may be arranged between consecutive memory cells in the first of the plurality of columns.

At least one other example embodiment provides a memory cell array comprising: a plurality of memory cells arranged in a plurality of rows and a plurality of columns, each memory cell in a first of the plurality of columns being connected between a first bitline and a first source line; and a first switch circuit connected in parallel with the first bitline, the first switch circuit being configured to selectively provide a current path from the first source line to a first line through (i) a selected memory cell in the first of the plurality of columns and (ii) the first bitline; wherein the current path traverses only a portion of the first bitline, and the first line is connected to one of ground and a voltage source.

The first switch circuit may be configured to selectively provide the current path based on a write voltage applied to the selected memory cell through the first source line.

The first switch circuit may be connected in series with memory cells in the first of the plurality of columns.

The selected memory cell may be a spin-transfer torque magnetoresistive random access memory (STT-MRAM) cell.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
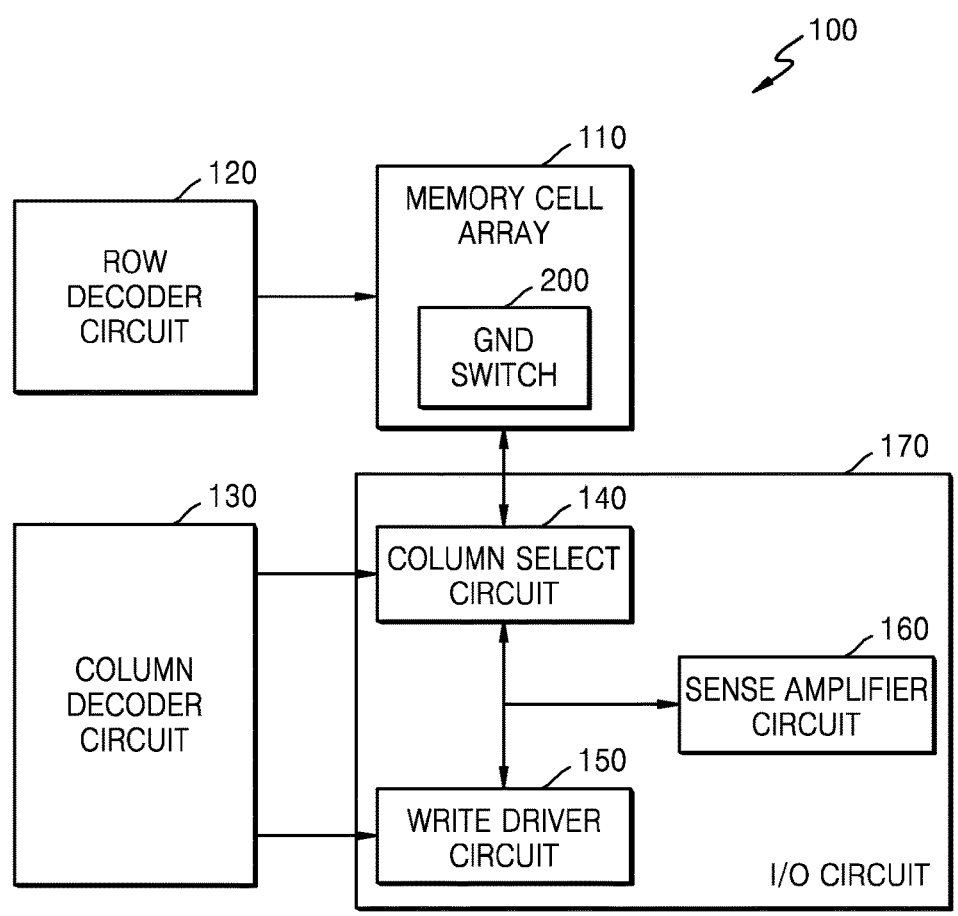
FIG. 1 is a diagram illustrating a memory apparatus having a ground switch, according to an example embodiment.

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Units, modules and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units and/or modules that perform various operations and/or functions to increase the clarity of the description. However, computer processing devices are not intended to be limited to these functional units and/or modules. For example, in one or more example embodiments, the various operations and/or functions of the functional units and/or modules may be performed by other ones of the functional units and/or modules. Further, the computer processing devices may perform the operations and/or functions of the various functional units and/or modules without sub-dividing the operations and/or functions of the computer processing units into these various functional units and/or modules.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications and/or modules that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a memory apparatus 100 having a ground switch, according to an example embodiment.

Referring to FIG. 1, the memory apparatus 100 may include a memory cell array 110, a row decoder circuit 120, a column decoder circuit 130, a column select circuit 140, a write driver circuit 150, and a sense amplifier circuit 160. The column select circuit 140, the write driver circuit 150, and the sense amplifier circuit 160 may be collectively referred to as an input/output (I/O) circuit 170 that performs a data write operation or a data read operation with respect to the memory apparatus 100.

The memory cell array 110 may include a plurality of memory cells arrayed in rows and columns.

In at least this example embodiment, the plurality of memory cells may be resistance-type memory cells, each including a variable resistance device having a variable resistor, or resistive memory cells. For example, when the variable resistance device is formed of a phase-change material (e.g., Ge—Sb—Te (GST)) and a resistance thereof is changed according to temperature, the memory apparatus 100 may be phase-change random-access memory (PRAM). As another example, when the variable resistance device is formed of an upper electrode, a lower electrode, and a complex metal oxide between the upper electrode and the lower electrode, the memory apparatus 100 may be resistive RAM (RRAM). As another example, when the variable resistance device is formed of a magnetic upper electrode, a magnetic lower electrode, and a dielectric between the magnetic upper electrode and the magnetic lower electrode, the memory apparatus 100 may be magnetoresistive RAM (MRAM).

When the memory apparatus 100 is MRAM, each of the memory cells has a cell transistor and a magnetoresistive element. The memory cell array 110 includes a plurality of wordlines, a plurality of bitlines, and a plurality of source lines that are connected to the memory cells.

The wordlines are respectively connected to gates of cell transistors of the memory cells positioned in the rows, and the bitlines and the source lines are connected to magnetoresistive elements and sources of the cell transistors of the memory cells positioned in the columns, respectively.

The memory cell array 110 includes a ground switch 200 to reduce a line resistance of the bitlines and the source lines. The ground switch 200 includes a first ground switch to ground a bitline selected by the column decoder circuit 130, and a second ground switch to ground a source line selected by the column decoder circuit 130. The memory cell array 110 is described in more detail with reference to FIG. 2.

The row decoder circuit 120 receives and decodes a row address, and activates one of the wordlines corresponding to the row address. The column select circuit 140 and the write driver circuit 150 are controlled according to an output from the row decoder circuit 120. The row decoder circuit 120 receives and decodes a column address. The column select circuit 140 selects one of the bitlines and one of the source lines, which correspond to the column address, and the selected bitline and the selected source line are connected to the write driver circuit 150 and the sense amplifier circuit 160.

A read or write voltage (e.g., a preset read or write voltage) is applied to the bitline and the source line, which are selected by the column select circuit 140, via the write driver circuit 150 according to a read or write operation. The sense amplifier circuit 160 determines whether data read from one of the memory cells in the memory cell array 110 is logic '0' or logic '1'.

Figure 2:
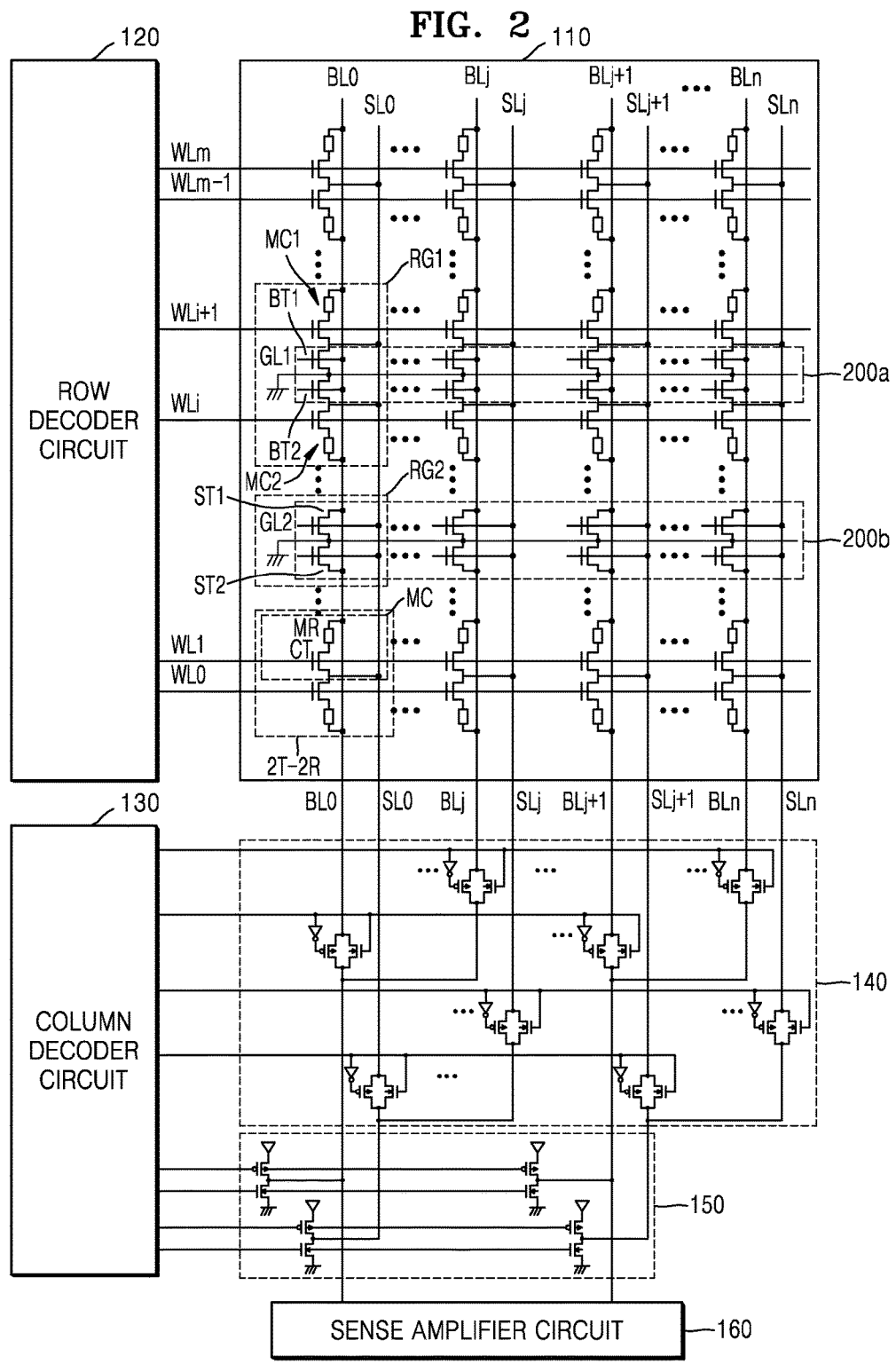
FIG. 2 is a diagram illustrating a memory cell array of FIG. 1 and peripheral circuits of the memory cell array according to an example embodiment.

FIG. 2 is a diagram illustrating the memory cell array 110 of FIG. 1 and peripheral circuits of the memory cell array 110 according to an example embodiment.

Referring to FIG. 2, the memory cell array 110 includes, in the form of a matrix of rows and columns, a plurality of memory cells MCs, a plurality of wordlines WL0 through WLm (abbreviated to WL if necessary), a plurality of bitlines BL0 through BLn (abbreviated to BL if necessary), a plurality of source lines SL0 through SLn (abbreviated to SL if necessary), and ground switches 200a and 200b (also referred to as first and second ground switches 200a and 200b). The memory cell MC may be embodied as an STT-MRAM cell. The memory cell MC may include a memory element formed as a magnetic tunnel junction (MTJ).

The memory cell MC may include a cell transistor CT and an MTJ structure MR. A gate of the cell transistor CT is connected to a wordline WL, a drain of the cell transistor CT is connected to one end of the MTJ structure MR, and a source of the cell transistor CT is connected to a source line SL. The other end of the MTJ structure MR is connected to a bitline BL. A 2T-2R structure in which two neighbouring memory cells MC are commonly connected to one source line SL may form one unit memory cell according to a layout. In at least one example embodiment, a 1T-1R structure in which one memory cell MC is connected to one bitline and one source line may form one unit memory cell according to a layout.

The ground switches 200a and 200b ground the bitlines BLs and the source lines SLs. The first ground switches 200a are disposed at the bitlines BLs and the source lines SLs, respectively, and are disposed between cell transistors CT in the unit memory cell of the 2T-2R structure. One of the first ground switches 200a includes a first transistor BT1 and a second transistor BT2. The first transistor BT1 is connected between a source of a cell transistor CT of a first memory cell MC1 and a first ground line GL1, and the second transistor BT2 is connected between a source of a cell transistor CT of a second memory cell MC2 and the first ground line GL1. Gates of the first and second transistors BT1 and BT2 are connected to bitlines BL0 corresponding thereto.

The second ground switches 200b are disposed at the bitlines BLs and the source lines SLs, respectively, and are disposed between the unit memory cells of the 2T-2R structure. One of the second ground switches 200b includes third and fourth transistors ST1 and ST2 that are connected between the bitline BL0 and a second ground line GL2. Gates of the third and fourth transistors ST1 and ST2 are connected to a first source line SL0 corresponding thereto. The first ground line GL1 and the second ground line GL2 are connected to a common ground line of the memory apparatus 100 (refer to FIG. 1).

Each of the first ground switches 200a includes two transistors BT1 and BT2, and each of the second ground switches 200b includes two transistors ST1 and ST2. This example allows a pattern of the first and second ground switches 200a and 200b to be repeated in the layout according to an array of the unit memory cells in the 2T-2R structure in the memory cell array 110. Therefore, the transistors BT1 and BT2 of the first ground switches 200a, and the transistors ST1 and ST2 of the second ground switches 200b may have a size equal or substantially equal to that of a cell transistor CT of a memory cell MC.

In at least one example embodiment, when the memory cell array 110 includes unit memory cells of a 1T-1R structure, one of the first ground switches 200a may include the first transistor BT1 connected between the source of the cell transistor CT of the first memory cell MC1 and the first ground line GL1, and one of the second ground switches 200b may include the third transistor ST1 connected between the bitline BL and the second ground line GL2. A gate of the first transistor BT1 is connected to a bitline BL corresponding thereto, and a gate of the third transistor ST1 is connected to a source line SL corresponding thereto.

Figure 3:
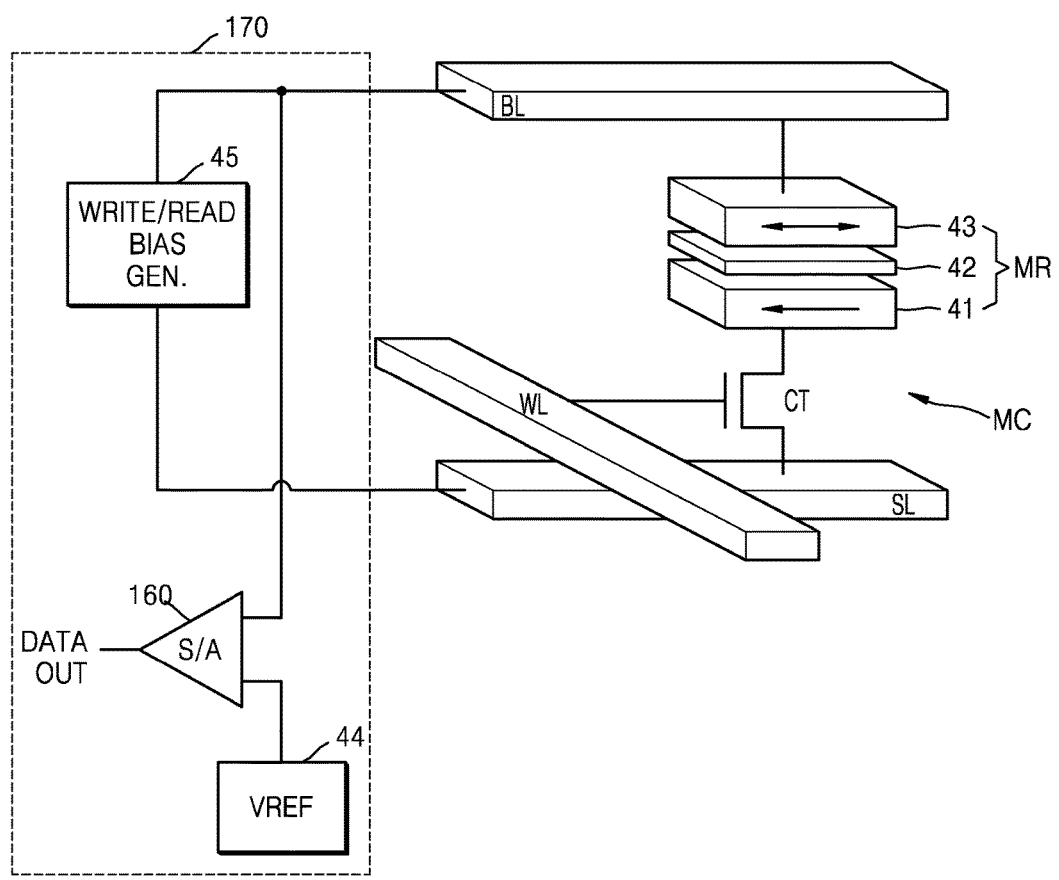
FIG. 3 is a three-dimensional perspective view illustrating an example embodiment of a memory cell in the memory cell array of FIG. 2.

FIG. 3 is a three-dimensional perspective view illustrating a memory cell in the memory cell array 110 of FIG. 2, according to an example embodiment.

Referring to FIG. 3, the memory cell MC includes a cell transistor CT and an MTJ structure MR. A gate of the cell transistor CT may be connected to a wordline WL, and one electrode of the cell transistor CT (e.g., a drain electrode of the cell transistor CT) may be connected to a bitline BL via the MTJ structure MR. The other electrode of the cell transistor CT (e.g., a source electrode of the cell transistor CT) may be connected to a source line SL.

The MTJ structure MR may include a pinned layer 41, a free layer 43, and a tunnel layer 42 between the pinned layer 41 and the free layer 43. A magnetization direction of the pinned layer 41 is pinned, and a magnetization direction of the free layer 43 may be parallel or anti-parallel relative to the magnetization direction of the pinned layer 41, according to data that is stored by a write operation. In order to pin the magnetization direction of the pinned layer 41, an anti-ferromagnetic layer may also be arranged.

In order to perform a write operation of an MRAM cell, a logic-high selection voltage may be applied to a selected wordline WL, so that a cell transistor CT may be turned on. To a selected bitline BL and a selected source line SL, a program current (also referred to as a write current), which is provided by write/read bias generator circuitry 45 (also referred to as a write/read bias generator) of the I/O circuit 170 may be applied. A direction of the write current may be determined according to a logic state to be stored in the MTJ structure MR.

In order to perform a read operation of the MRAM cell, the logic-high selection voltage may be applied to the selected wordline WL, and thus, the cell transistor CT may be turned on, and a read current may be applied from the write/read bias generator 45 to a selected bitline BL and a selected source line SL. Accordingly, a voltage may develop at both end terminals of the MTJ structure MR, and may be sensed by the sense amplifier circuit 160. The sensed voltage may be compared with a voltage of reference voltage generator circuitry 44 (also referred to as a reference voltage generator) to determine a logic state stored in the MTJ structure MR. According to a result of the comparison, data stored in the MTJ structure MR may be determined.

Figure 4A:
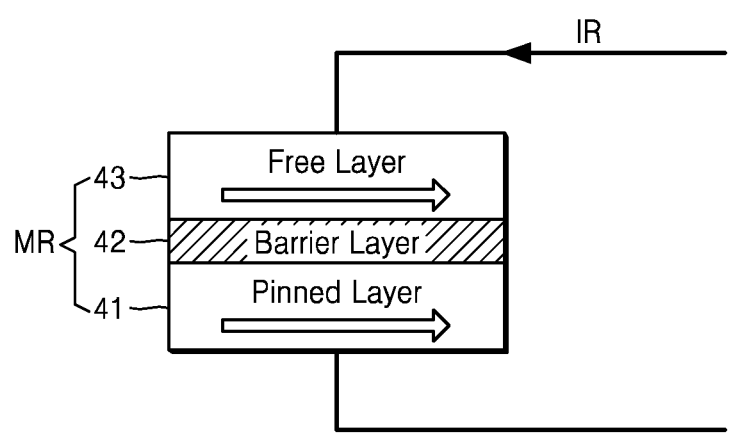
FIGS. 4A and 4B are diagrams each illustrating data stored according to a magnetization direction in a magnetic tunnel junction (MTJ) structure of FIG. 3, according to an example embodiment.
Figure 4B:
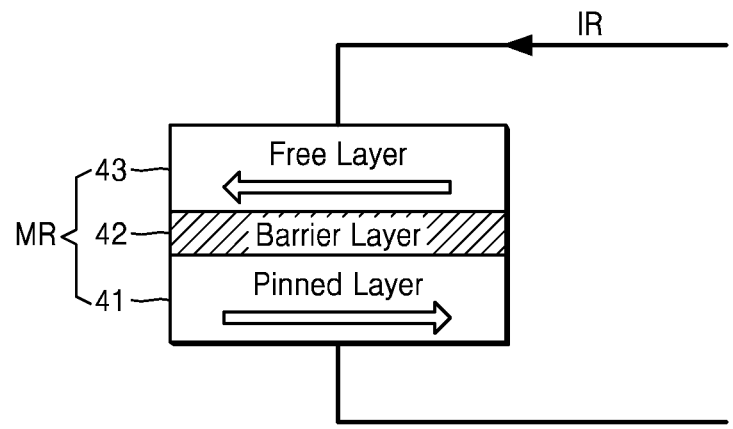

FIGS. 4A and 4B are diagrams each illustrating data stored according to a magnetization direction in the MTJ structure MR of FIG. 3, according to an example embodiment.

Referring to FIGS. 4A and 4B, a resistance value of the MTJ structure MR may be changed according to a magnetization direction of the free layer 43. When a read current IR flows through the MTJ structure MR, a data voltage according to the resistance value of the MTJ structure MR may be output. Since intensity of the read current IR is less (e.g., significantly or substantially less) than intensity of a write current, the magnetization direction of the free layer 43 is not changed due to the read current IR.

As illustrated in FIG. 4A, the magnetization direction of the free layer 43 and a magnetization direction of the pinned layer 41 may be parallel with each other in the MTJ structure MR. The MTJ structure MR in this state may have a low resistance value, and may output data '0' via a read operation.

As illustrated in FIG. 4B, the magnetization direction of the free layer 43 may be anti-parallel with the magnetization direction of the pinned layer 41 in the MTJ structure MR. The MTJ structure MR in this state may have a high resistance value, and thus may output data '1' via a read operation.

Figure 7:
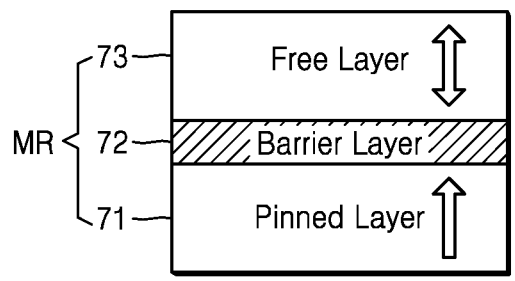

In the MTJ structure MR of the present example embodiment, the free layer 43 and the pinned layer 41 have a horizontally magnetic device structure, but this is for convenience of description. According to one or more example embodiments, in the MTJ structure MR the free layer 43 and the pinned layer 41 may have a vertically magnetic device structure as shown in FIG. 7.

Figure 5:
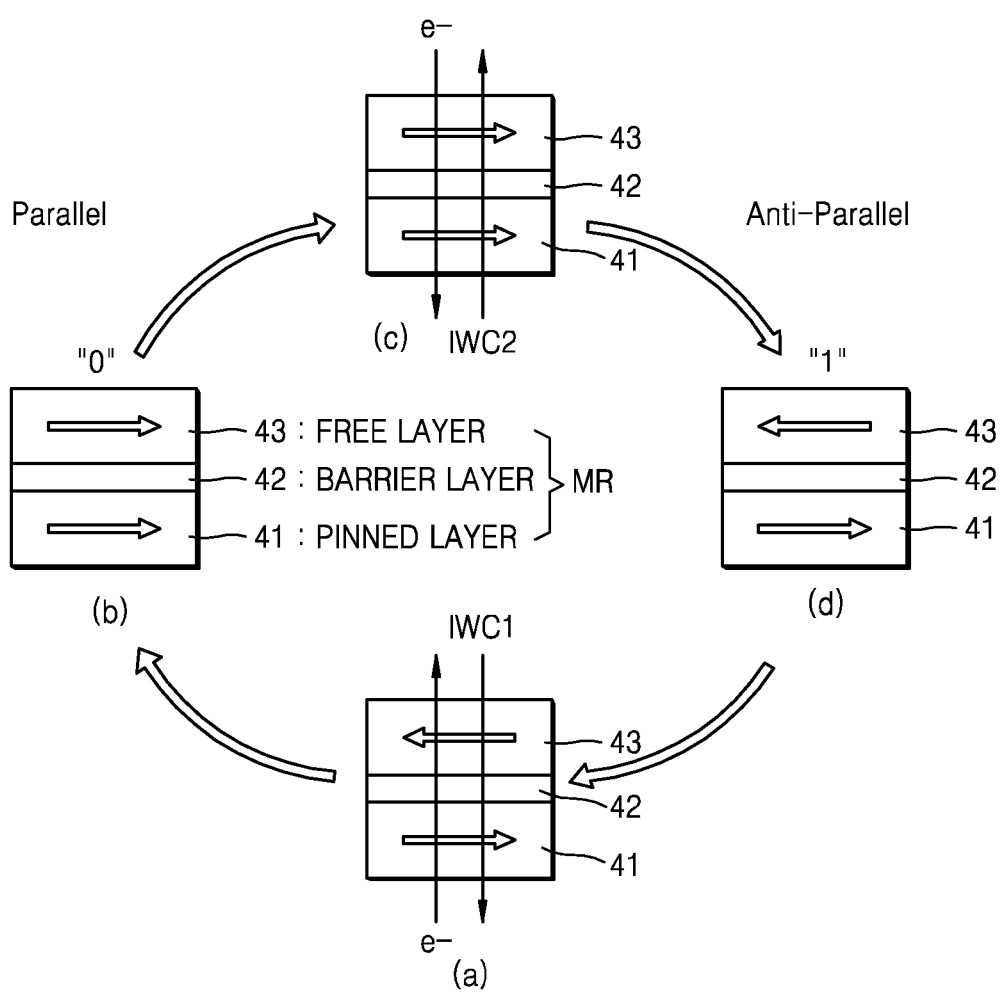
FIG. 5 is a diagram illustrating an example write operation in the MTJ structure of FIG. 3, according to an example embodiment.

FIG. 5 is a diagram illustrating a write operation in the MTJ structure MR of FIG. 3, according to an example embodiment.

Referring to FIG. 5, according to a direction of a write current IW that flows through the MTJ structure MR, a magnetization direction of the free layer 43 may be determined or set. For example, as in (a) of FIG. 5, when a first write current IWC1 is applied in a direction from the free layer 43 toward the pinned layer 41, free electrons having a same spin direction as the pinned layer 41 apply a torque to the free layer 43. Accordingly, the free layer 43 may be magnetized in a parallel direction with the pinned layer 41. Therefore, data '0' having a low resistance value may be stored in an MTJ structure MR as shown in (b) of FIG. 5.

In the MTJ structure MR having a status of data '0', when a second write current IWC2 is applied from the pinned layer 41 to the free layer 43 as shown in (c) of FIG. 5, electrons having an opposite spin as the pinned layer 41 return to the free layer 43 and apply a torque thereto. Accordingly, the free layer 43 may be magnetized in an anti-parallel direction with the pinned layer 41. By doing so, data '1' having a high resistance value may be stored in an MTJ structure MR as shown in (d) of FIG. 5.

The magnetization direction of the free layer 43 in the MTJ structure MR may be changed to a parallel direction or an anti-parallel direction relative to the pinned layer 41, due to a spin-transfer torque (STT). According to a change thereof, data '0' or data '1' may be stored.

FIGS. 6A through 8B are diagrams illustrating examples of the MTJ structure MR of FIG. 3, according to example embodiments.

Figure 6A:
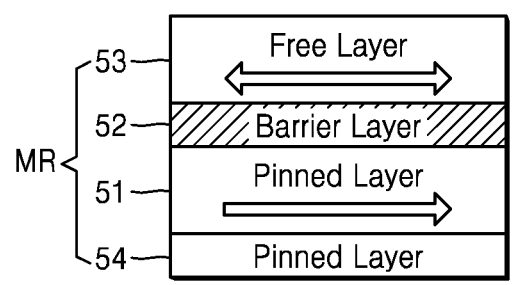
FIGS. 6A through 8B are diagrams illustrating examples of the MTJ structure of FIG. 3, according to example embodiments.

Referring to FIG. 6A, the MTJ structure MR may include a pinned layer 51, a tunnel layer 52 (hereinafter, a tunnel layer may also be referred to as a barrier layer), a free layer 53, and an anti-ferromagnetic layer 54. The free layer 53 may include a material whose magnetization direction is changeable. A magnetization direction of the free layer 53 may be changed according to electric and/or magnetic factors that are provided from an external source and/or an internal source of a memory cell. The free layer 53 may include a ferromagnetic material including at least one of cobalt (Co), iron (Fe), nickel (Ni), alloys thereof, or the like. For example, the free layer 53 may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and the like.

The tunnel layer 52 may have a thickness that is less than a spin diffusion distance. The tunnel layer 52 may include a non-magnetic material. For example, the tunnel layer 52 may include at least one of magnesium (Mg), titanium (Ti), aluminium (Al), oxide of magnesium-zinc (MgZn) and magnesium-boron (MgB), nitride of titanium (T) and vanadium (V), and the like.

The pinned layer 51 may have a magnetization direction that is pinned by the anti-ferromagnetic layer 54. The pinned layer 51 may include a ferromagnetic material. For example, the pinned layer 51 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and the like.

The anti-ferromagnetic layer 54 may include an anti-ferromagnetic material. For example, the anti-ferromagnetic layer 54 may include at least one of PtMn, IrMn, MnO, MnS, MnTe, $MnF_2$, $FeCl_2$, FeO, $CoCl_2$, CoO, $NiCl_2$, NiO, Cr, alloys thereof, and the like.

In the MTJ device MR, each of the free layer 53 and the pinned layer 51 is formed as a ferromagnetic body. Thus, a stray field may be generated at an edge of the ferromagnetic body. The stray field may decrease a magnetic resistance or may increase a resistive magnetic force of the free layer 53. Furthermore, the stray field may affect a switching characteristic, which may result in asymmetrical switching. Therefore, a structure for decreasing and/or controlling the stray field that is generated at the ferromagnetic body in the MTJ structure MR may be needed.

Figure 6B:
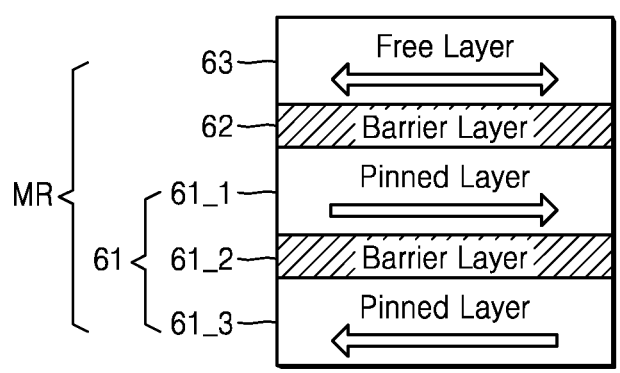

Referring to FIG. 6B, the MTJ structure MR may include a pinned layer 61, a tunnel layer 62, and a free layer 63. The pinned layer 61 may be provided as a synthetic antiferromagnetic (SAF). The pinned layer 61 may include a first ferromagnetic layer 61_1, a coupling layer 61_2, and a second ferromagnetic layer 61_3. Each of the first ferromagnetic layer 61_1 and the second ferromagnetic layer 61_3 may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and the like. A magnetization direction of the first ferromagnetic layer 61_1 is different from a magnetization direction of the second ferromagnetic layer 61_3, and each of the magnetization directions may be pinned. The coupling layer 61_2 may include ruthenium (Ru). However, example embodiments are not limited to this example.

Referring to FIG. 7, a magnetization direction of an MTJ structure MR may be perpendicular to a tunnel layer 72, so that a shift direction of a current may be parallel or substantially parallel to a magnetization easy axis. When the magnetization direction is perpendicular in the MTJ structure MR, this structure is called a perpendicular MTJ structure MR.

The perpendicular MTJ structure MR may also include a pinned layer 71, a tunnel layer 72, and a free layer 73. When a magnetization direction of the free layer 73 and a magnetization direction of the pinned layer 71 are parallel, a resistance value may decrease. When the magnetization direction of the free layer 73 and the magnetization direction of the pinned layer 71 are anti-parallel, the resistance value may increase. Therefore, according to the resistance value, data may be stored in the perpendicular MTJ structure MR.

In order to embody the perpendicular MTJ structure MR, each of the free layer 73 and the pinned layer 71 may be formed of a material having relatively high magnetic anisotropy energy. Examples of the material having relatively high magnetic anisotropy energy may include an amorphous rare earth raw material alloy, a multilayer thin film such as $(Co/Pt)_n$ or $(Fe/Pt)_n$, or the like. For example, each of the free layer 73 and the pinned layer 71 may be an ordered alloy including at least one of Fe, Co, Ni, palladium (Pa), platinum (Pt), alloys thereof, and the like. For example, each of the free layer 73 and the pinned layer 71 may include at least one of a Fe—Pt alloy, a Fe—Pd alloy, a Co—Pd alloy, a Co—Pt alloy, a Fe—Ni—Pt alloy, a Co—Fe—Pt alloy, a Co—Ni—Pt alloy, etc. When the aforementioned alloys are expressed in a stoichiometric manner, the alloys may include $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$.

Figure 8A:
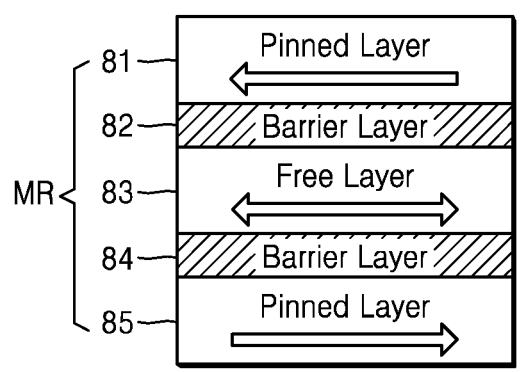

FIG. 8A illustrates a dual MTJ structure MR in which a tunnel layer and a pinned layer are disposed at each end of a free layer. The dual MTJ structure MR that generates a horizontal magnetic direction field may include a first pinned layer 81, a first tunnel layer 82, a free layer 83, a second tunnel layer 84, and a second pinned layer 85. A material that forms the first and second pinned layers 81 and 85 may be similar to or the same as that of the pinned layer 51 of FIG. 6A. A material of the first and second tunnel layers 82 and 84 may be similar to or the same as that of the tunnel layer 52 of FIG. 6A. A material of the free layer 83 may be similar to or the same as that of the free layer 53 of FIG. 6A.

When a magnetization direction of the first pinned layer 81 and a magnetization direction of the second pinned layer 85 are pinned in opposite directions, a magnetic force due to the first and second pinned layers 81 and 85 may be offset or substantially offset. The dual MTJ structure MR may perform a read operation by using a less current than a more common MTJ device. Due to the second tunnel layer 84, the dual MTJ structure MR provides relatively high resistance during a read operation, so that a clearer data value may be obtained.

Figure 8B:
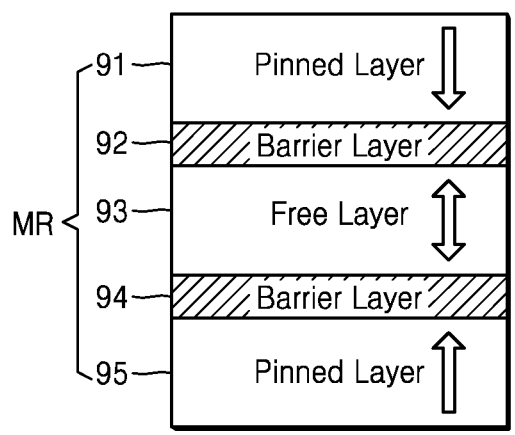

Referring to FIG. 8B, a perpendicular dual MTJ structure MR that generates a perpendicular magnetic direction field may include a first pinned layer 91, a first tunnel layer 92, a free layer 93, a second tunnel layer 94, and a second pinned layer 95. A material that forms the first and second pinned layers 91 and 95 may be similar to or the same as that of the pinned layer 71 of FIG. 7. A material of the first and second tunnel layers 92 and 94 may be similar to or the same as that of the tunnel layer 72 of FIG. 7. A material of the free layer 93 may be similar to or the same as that of the free layer 73 of FIG. 7.

When a magnetization direction of the first pinned layer 91 and a magnetization direction of the second pinned layer 95 are pinned in opposite directions, a magnetic force due to the first and second pinned layers 91 and 95 may be offset or substantially offset. The perpendicular dual MTJ structure MR may perform a read operation by using a less current than a more common MTJ device. The perpendicular dual MTJ structure MR may provide a relatively high resistance, and thus, may allow a more accurate data value to be obtained during a read operation.

FIGS. 9A through 9D are diagrams illustrating an example line resistance difference in the memory cell array 110, according to an example embodiment.

Figure 9A:
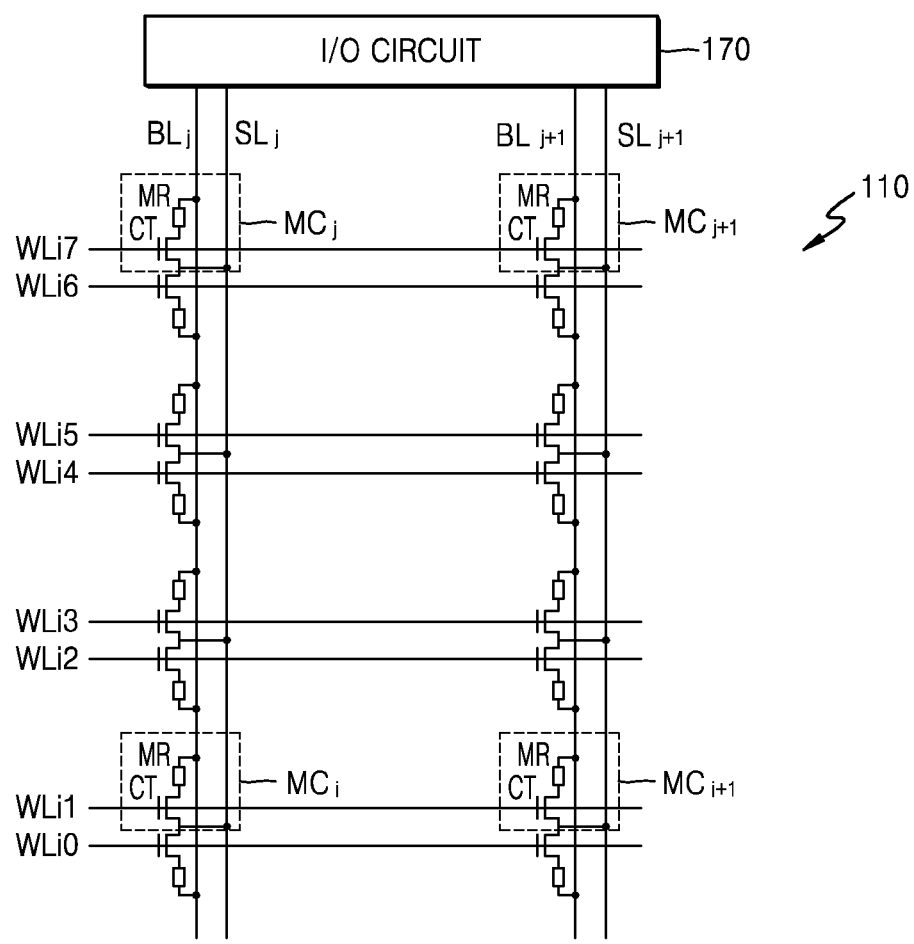
FIGS. 9A through 9D are diagrams illustrating an example line resistance difference in the memory cell array according to an example embodiment.

Referring to FIG. 9A, it is assumed that, in a portion of the memory cell array 110, a memory cell $MC_j$ and a memory cell $MC_{j+1}$ that are connected to a wordline WLi7 are disposed relatively close to the I/O circuit 170, and a memory cell $MC_i$ and a memory cell $MC_{i+1}$ that are connected to a wordline WLi1 are disposed relatively far from the I/O circuit 170. A data '0' write operation and a read operation on the memory cells $MC_i$ and $MC_j$ is described with reference to FIG. 9B, and a data '1' write operation on the memory cells $MC_{i+1}$ and $MC_{j+1}$ is described with reference to FIG. 9C.

Figure 9B:
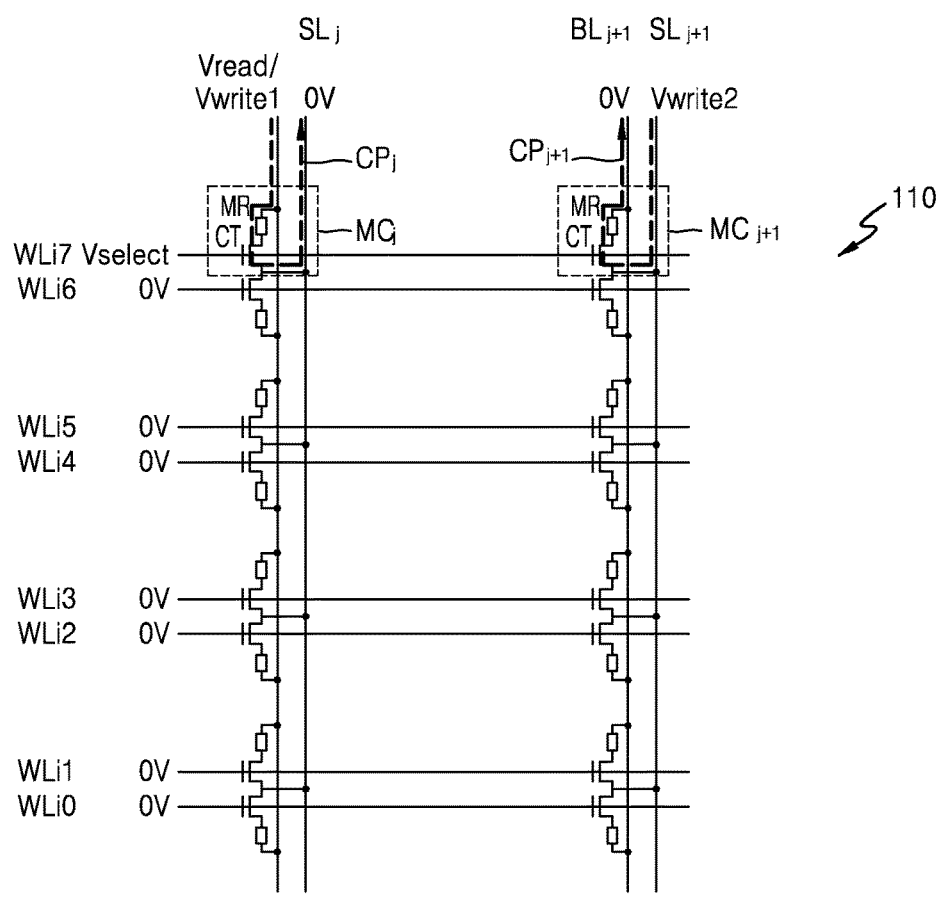

Referring to FIG. 9B, to perform the data '0' write operation on the memory cell $MC_j$, a selection voltage Vselect is applied to the wordline WLi7 to turn on a cell transistor CT, a first write voltage Vwrite1 is applied to a bitline $BL_j$ due to the I/O circuit 170, and a ground voltage GND is applied to a source line $SL_j$ due to the I/O circuit 170. According to the data '0' write operation of the memory cell $MC_j$, a current path $CP_j$ may be formed from the bitline $BL_j$ through the memory cell $MC_j$ to the source line $SL_j$.

To perform the read operation on the memory cell $MC_j$, the selection voltage Vselect is applied to the wordline WLi7 to turn on the cell transistor CT, a read voltage Vread is applied to the bitline $BL_j$ due to the I/O circuit 170, and the ground voltage GND is applied to an source line $SL_j$ due to the I/O circuit 170. According to the read operation on the memory cell $MC_j$, in the same or substantially the same manner as the data '0' write operation, the current path $CP_j$ may be formed from the bitline $BL_j$ through the memory cell $MC_j$ to the source line $SL_j$.

To perform the data '1' write operation on the memory cell $MC_{j+1}$, the selection voltage Vselect is applied to the wordline WLi7 to turn on the cell transistor CT, the ground voltage GND is applied to a bitline $BL_{j+1}$ due to the I/O circuit 170, and a second write voltage Vwrite2 is applied to a source line $SL_{j+1}$ due to the I/O circuit 170. According to the data '1' write operation on the memory cell $MC_{j+1}$, a current path $CP_{j+1}$ may be formed from the source line $SL_{j+1}$ through the memory cell $MC_{j+1}$ to the bitline $BL_{j+1}$.

Figure 9C:
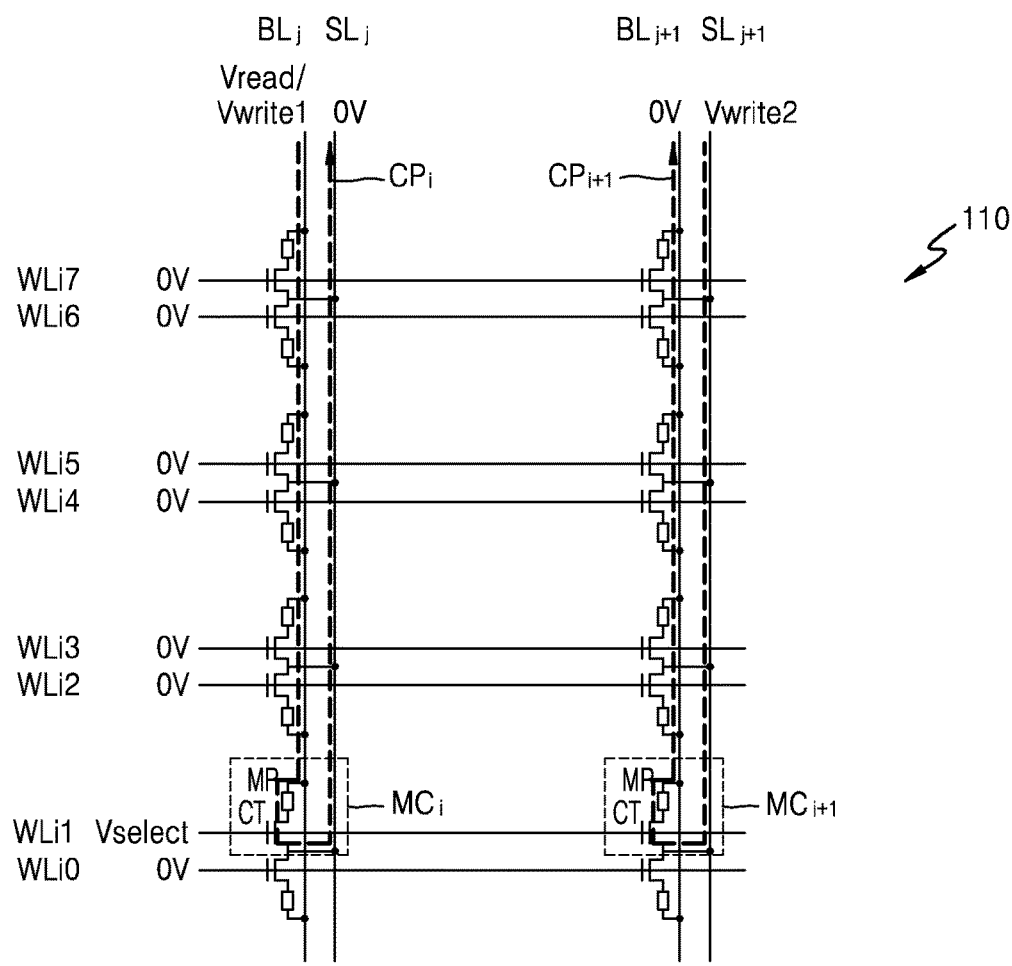

Referring to FIG. 9C, to perform a data '0' write operation and a read operation on the memory cell $MC_i$, the selection voltage Vselect is applied to the wordline WLi1 to turn on the cell transistor CT, the first write voltage Vwrite1 or the read voltage Vread is applied to the bitline $BL_j$ due to the I/O circuit 170, and the ground voltage GND is applied to the source line $SL_j$ due to the I/O circuit 170. According to the data '0' write operation and the read operation on the memory cell $MC_i$, a current path $CP_i$ may be formed from the bitline $BL_j$ through the memory cell $MC_i$ to the source line $SL_j$.

To perform a data '1' write operation on the memory cell $MC_{i+1}$, the selection voltage Vselect is applied to the wordline WLi1 to turn on a cell transistor CT, the ground voltage GND is applied to a bitline $BL_{j+1}$ due to the I/O circuit 170, and the second write voltage Vwrite2 is applied to a source line $SL_{j+1}$ due to the I/O circuit 170. According to the data '1' write operation on the memory cell $MC_{j+1}$, a current path $CP_{j+1}$ may be formed from the source line $SL_{j+1}$ through the memory cell $MC_{i+1}$ to the bitline $BL_{j+1}$.

Figure 9D:
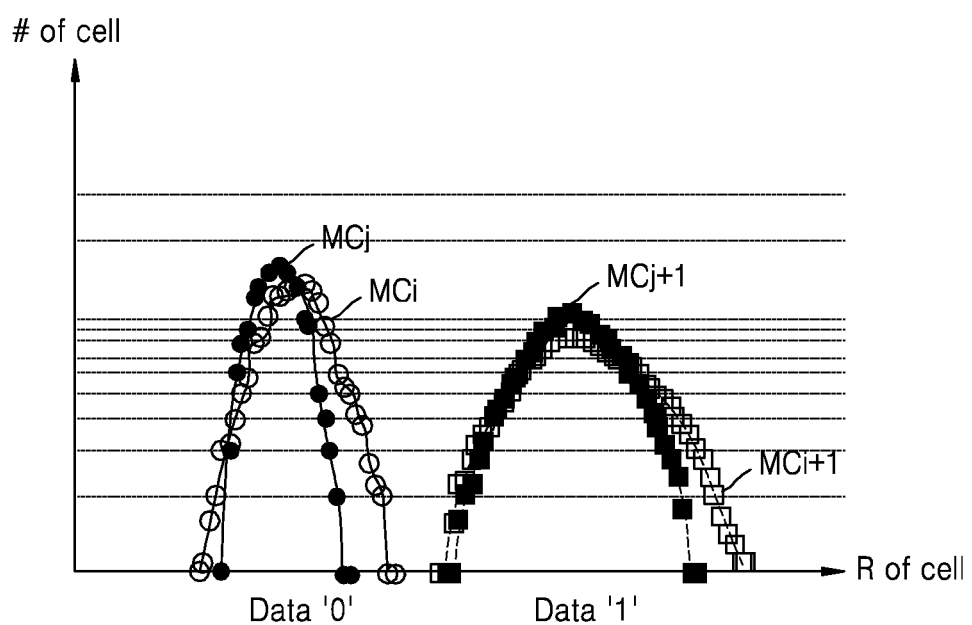

Referring to FIGS. 9B and 9C, the current path $CP_i$ according to the write and read operations on the memory cell $MC_i$ and the current path $CP_j$ according to the write and read operations on the memory cell $MC_j$ show a physical distance difference. Since an MRAM semiconductor manufacturing procedure becomes relatively small or minute, a sheet resistance of a metal line that forms bitlines BLs and source lines SLs increases, such that a line resistance value of a current path increases. Accordingly, a difference between line resistance values of the current path $CP_i$ and the current path $CP_j$ is further increased, such that, as illustrated in FIG. 9D, a spread of a resistance distribution of data '0' stored in the memory cells $MC_i$ and $MC_j$ increases.

Similarly, a difference between a line resistance value of the current path $CP_{j+1}$ of the memory cell $MC_{j+1}$ and a line resistance value of the current path $CP_j$ of the memory cell $MC_{j+1}$ increases, such that a spread of a resistance distribution of data '1' stored in the memory cells $MC_{i+1}$ and $MC_{j+1}$ increases. When the spread of the resistance distribution of data '0' and the spread of the resistance distribution of data '1' increases, a sensing margin between data '0' and data '1' may be insufficient such that it may be relatively difficult to read data.

Hereinafter, various example embodiments in which a line resistance difference is improved by disposing a ground switch in a memory cell array to decrease the aforementioned cell resistance distribution error are described in more detail.

Figure 10:
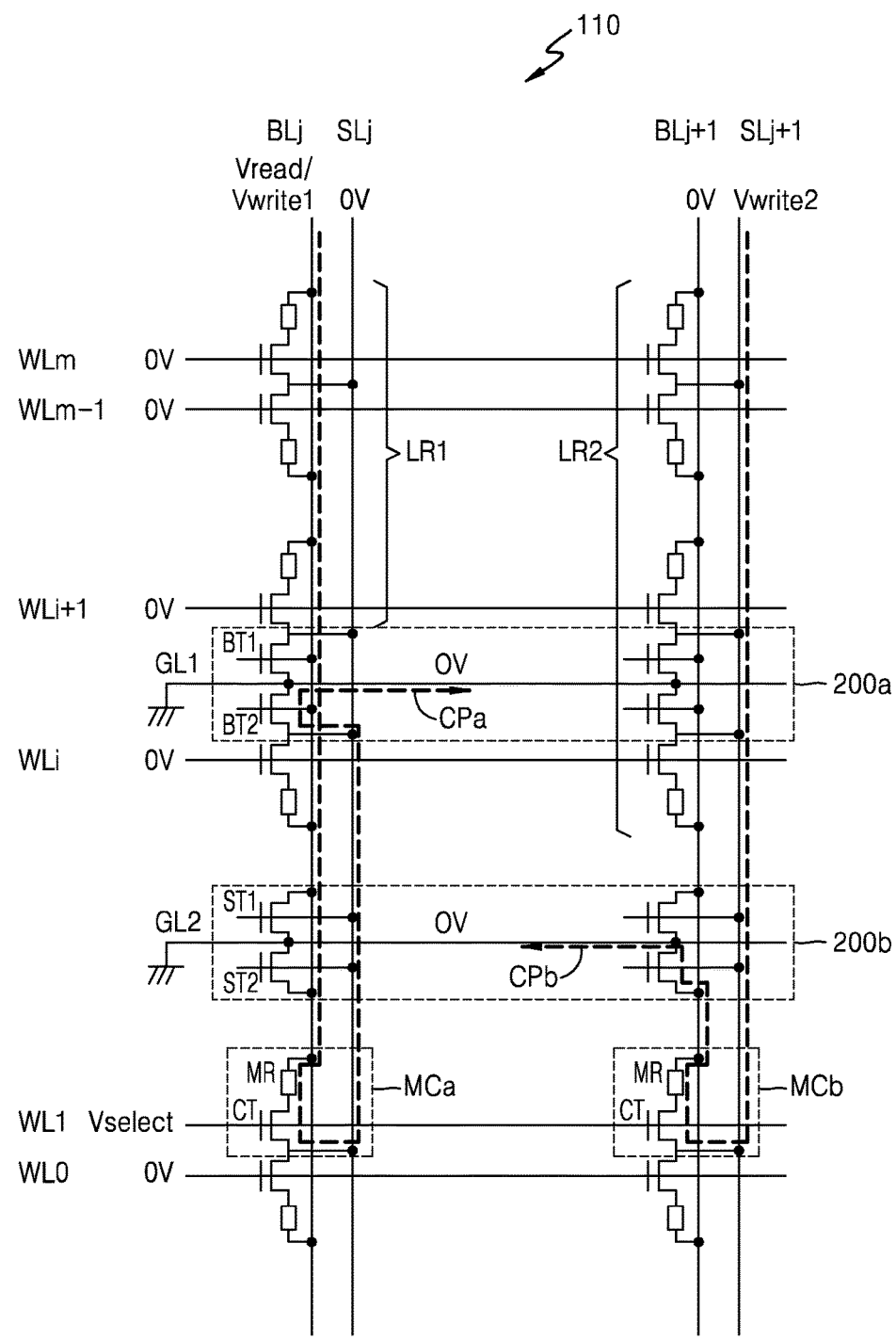
FIG. 10 is a diagram illustrating example operations of a ground switch, according to an example embodiment.

FIG. 10 is a diagram illustrating operations of a ground switch, according to an example embodiment.

Referring to FIG. 10, as a portion of the memory cell array 110 (refer to FIG. 2), FIG. 10 illustrates memory cells MCs and first and second ground switches 200a and 200b that are connected to bitlines (BLj and BLj+1) and source lines (SLj and SLj+1) that correspond to two columns from among a plurality of columns in the memory cell array 110. With respect to the memory cell array 110, a memory cell MCa and a memory cell MCb that are connected to a wordline WL1 are selected, data '0' is written to and is read from the memory cell MCa as described, and data '1' is written to the memory cell MCb.

In order to write data '0' to the memory cell MCa, a selection voltage Vselect is applied to the wordline WL1 to turn on a cell transistor CT of the memory cell MCa, a first write voltage Vwrite1 is applied to the bitline BLj, and a ground voltage GND is applied to the source line SLj. Then, first and second transistors BT1 and BT2 of the first ground switch 200a are turned on by the first write voltage Vwrite1 of the bitline BLj, and the source line SLj and a first ground line GL1 are connected via the first and second transistors BT1 and BT2 that are turned on. Accordingly, during a data '0' write operation with respect to the memory cell MCa, a first write current path CPa is formed from the bitline BLj through the memory cell MCa, the source line SLj, and the second transistor BT2 of the first ground switch 200a to the first ground line GL1.

In the first write current path CPa, a line resistance LR1 that corresponds to an outer line of a point in an entire line of the source line SLj is not regarded as a load, wherein, at the point, the source line SLj is connected to the first ground line GL1 via the second transistor BT2 of the first ground switch 200a. That is, for example, the first write current path CPa forms a short current path in which the line resistance LR1 is excluded from the entire line of the SLj source line.

During a read operation with respect to the memory cell MCa, the selection voltage Vselect is applied to the wordline WL1 to turn on the cell transistor CT of the memory cell MCa, a read voltage Vread is applied to the bitline BLj, and the ground voltage GND is applied to the source line SLj. Then, the first and second transistors BT1 and BT2 of the first ground switch 200a are turned on by the read voltage Vread of the bitline BLj, and the source line SLj and the first ground line GL1 are connected. Accordingly, in the same or substantially the same manner as the data '0' write operation, a read current path CPa is formed from the bitline BLj through the memory cell MCa, the source line SLj, and the second transistor BT2 of the first ground switch 200a to the first ground line GL1. The read current path CPa of the memory cell MCa forms a short current path in which the line resistance LR1 is excluded from the entire line of the source line SLj.

In order to write data '1' to the memory cell MCb, a selection voltage Vselect is applied to the wordline WL1 to turn on a cell transistor CT of the memory cell MCb, a ground voltage GND is applied to the bitline BLj+1, and a second write voltage Vwrite2 is applied to the source line SLj+1. Then, third and fourth transistors ST1 and ST2 of the second ground switch 200b are turned on by the second write voltage Vwrite2 of the source line SLj+1, and the bitline BLj+1 and a second ground line GL2 are connected via the third and fourth transistors ST1 and ST2 that are turned on. Accordingly, during the write operation with respect to the memory cell MCb, a second write current path CPb is formed from the the source line SLj+1 through the memory cell MCb, the bitline BLj+1, and the fourth transistor ST2 of the second ground switch 200b to the second ground line GL2.

In the second write current path CPb, a line resistance LR2 that corresponds to an outer line of a point in an entire line of the bitline BLj+1 is not regarded as a load, wherein, at the point, the bitline BLj+1 is connected to the second ground line GL2 via the fourth transistor ST2 of the second ground switch 200b. That is, for example, the second write current path CPb forms a short current path in which the line resistance LR2 is excluded from the entire line of the bitline BLj+1.

As described above, during the write/read operations with respect to the memory cell MC, line resistances of the source line SL and the bitline BL in the memory cell array 110 may be decreased by the first and second ground switches 200a and 200b. Therefore, a data distribution due to line resistances of the memory cells MCs may be decreased, so that a data sensing margin may be improved and/or ensured.

Figure 13:
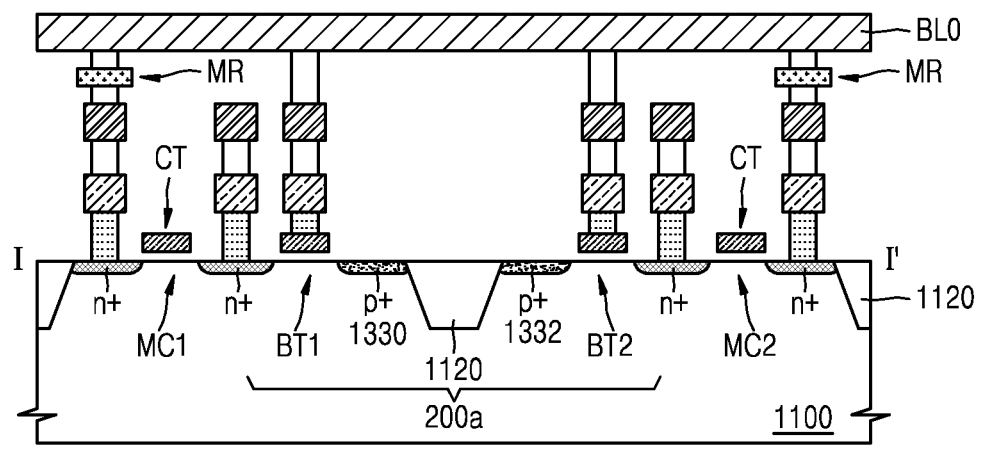
Figure 14:
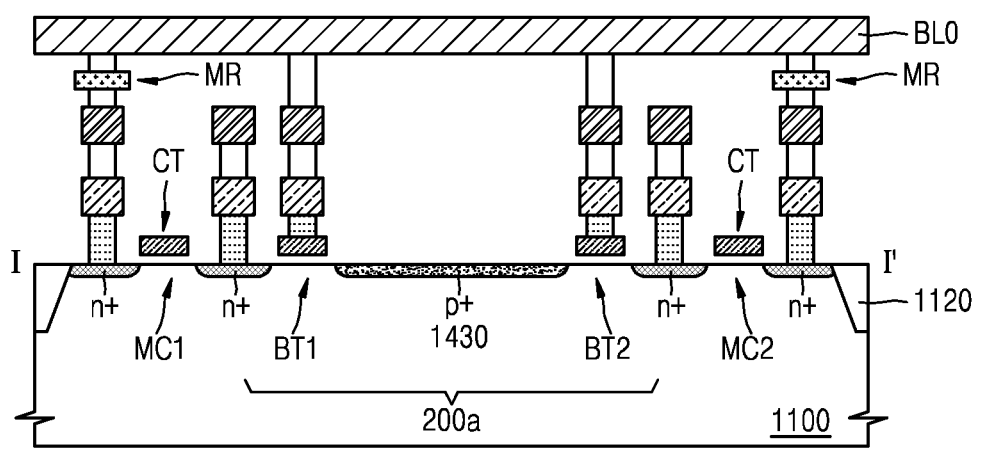
Figure 15:
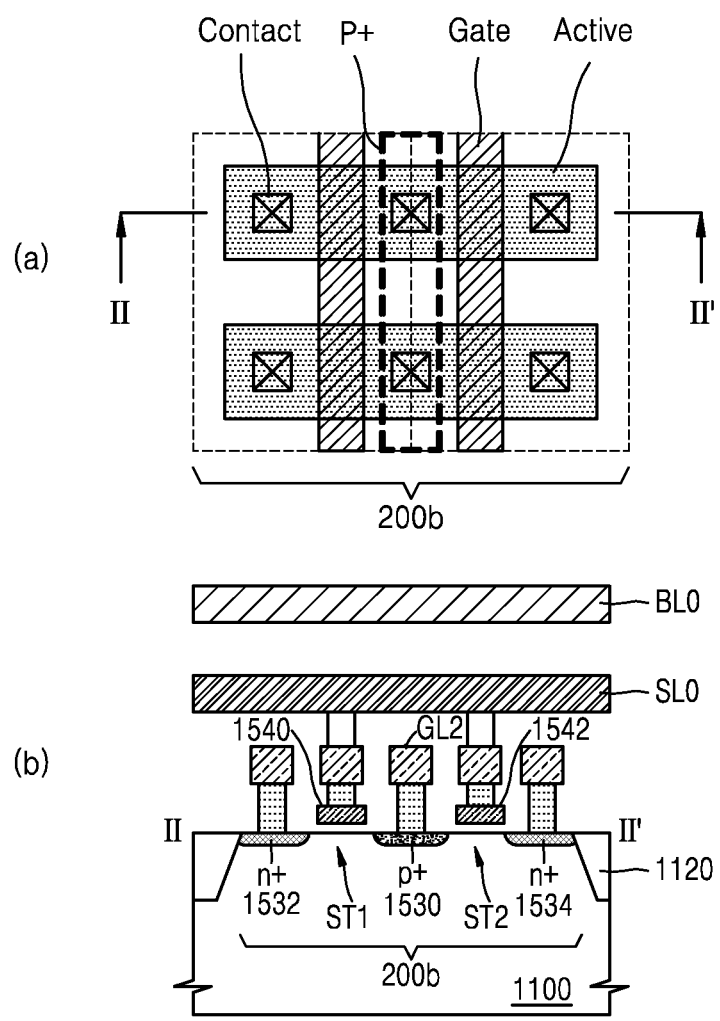
Figure 16:
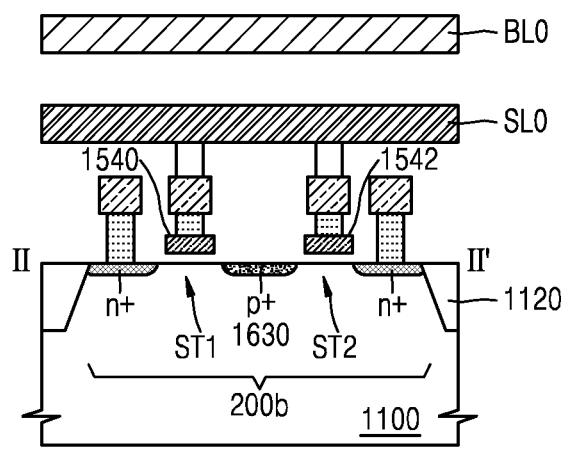

FIGS. 11 through 16 are diagrams illustrating a layout and a cross-sectional view of a portion of a memory cell array including a ground switch, according to example embodiments. FIGS. 11 through 14 illustrate an example layout and cross-sectional view related to a first ground switch of a first region RG1 of the memory cell array 110 of FIG. 2, and FIGS. 15 and 16 illustrate an example layout and cross-sectional view related to a second ground switch of a second region RG2 of the memory cell array 110 of FIG. 2.

Figure 11:
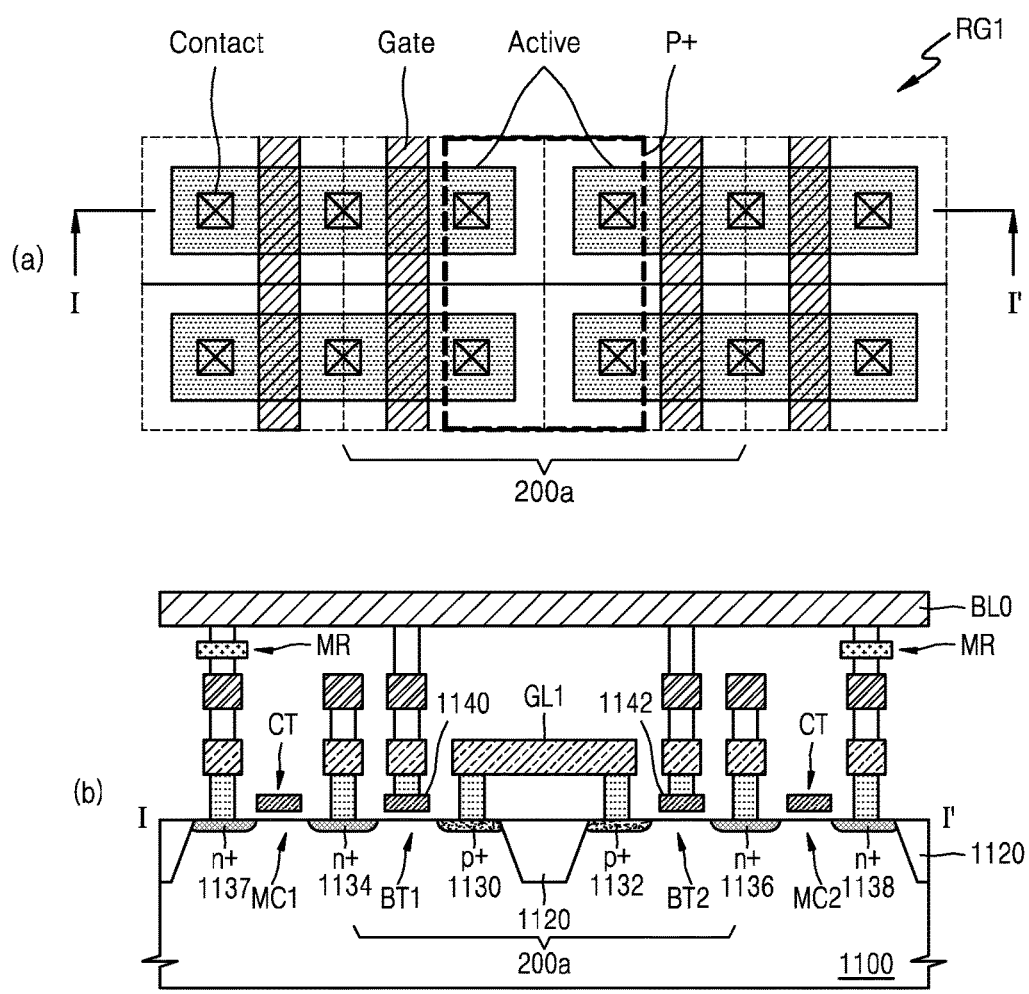
FIGS. 11 through 16 are diagrams illustrating a layout and a cross-sectional view of a portion of a memory cell array including a ground switch, according to example embodiments.

Referring to FIG. 11, active regions in the first ground switch 200a are separated in the layout of the first region RG1 of the memory cell array 110 (refer to FIG. 2). Referring to an I-I' cross-sectional view of the layout of the first region RG1, the first and second transistors BT1 and BT2 of the first ground switch 200a are formed on the active regions that are separated on a semiconductor substrate 1100 by isolation layers 1120. Each of the first and second transistors BT1 and BT2 has a same or substantially the same size as a cell transistor of a memory cell MC. A width and length of each of gates of the first and second transistors BT1 and BT2 are the same or substantially the same as a width and length of a gate of the cell transistor of the memory cell MC.

In at least some example embodiments, the semiconductor substrate 1100 may be replaced with a p-well formed in a semiconductor substrate.

Sources of the first and second transistors BT1 and BT2 are formed as p+ contact regions 1130 and 1132, respectively, and are electrically connected to a first ground line GL1. The p+ contact regions 1130 and 1132 may provide a substrate bias voltage of the p-type semiconductor substrate 1100. Gates 1140 and 1142 of the first and second transistors BT1 and BT2 are electrically connected to a bitline BL0, and drains of the first and second transistors BT1 and BT2 are respectively connected to n+ sources 1134 and 1136 of cell transistors CT of neighbouring memory cells MC1 and MC2. An MTJ structure MR that is electrically connected to n+ drains 1137 and 1138 of the cell transistors CT of the memory cells MC1 and MC2 is formed, and the MTJ structure MR is electrically connected to the bitline BL0.

Figure 12:
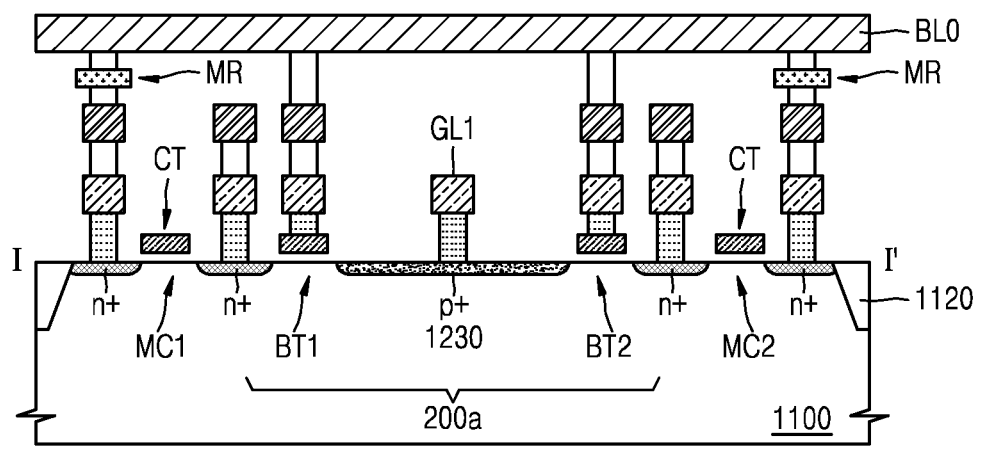

Referring to FIG. 12, a cross-sectional view of FIG. 12 is substantially the same as the cross-sectional view of FIG. 11, except that sources of the first and second transistors BT1 and BT2 of the first ground switch 200a are formed as one p+ contact region 1230 and are electrically connected to a first ground line GL1.

Referring to FIG. 13, a cross-sectional view of FIG. 13 is substantially the same as the cross-sectional view of FIG. 11, except that sources 1330 and 1332 of the first and second transistors BT1 and BT2 of the first ground switch 200a do not form p+ contact regions on active regions that are separated on the semiconductor substrate 1100 by the isolation layers 1120. In this case, the sources 1330 and 1332 of the first and second transistors BT1 and BT2 are biased by a bias of the semiconductor substrate 1100 or a p-well bias provided from an outer source of the memory cell array 110.

Referring to FIG. 14, a cross-sectional view of FIG. 14 is substantially the same as the cross-sectional view of FIG. 12, except that sources of the first and second transistors BT1 and BT2 of the first ground switch 200a are formed as one p+ impurity region 1430 and do not form p+ contact regions. In this case, the sources 1430 of the first and second transistors BT1 and BT2 are biased by a bias of the semiconductor substrate 1100 or a p-well bias provided from an outer source of the memory cell array 110.

Referring to FIG. 15, a p+ contact region 1530 is formed in an active region in the second ground switch 200b in a layout of a second region RG2 of the memory cell array 110 (refer to FIG. 2). Referring to a cross-sectional view II-II' of the layout of the second region RG2, the third and fourth transistors ST1 and ST2 of the second ground switch 200b are formed in active regions defined on the semiconductor substrate 1100 by the isolation layers 1120. Each of the third and fourth transistors ST1 and ST2 has a size equal or substantially equal to a size of a cell transistor CT of a memory cell MC. A width and length of each of gates of the third and fourth transistors ST1 and ST2 are the same or substantially the same as a width and length of a gate of the cell transistor CT of the memory cell MC.

Sources of the third and fourth transistors ST1 and ST2 are formed as one p+ contact region 1530 and are electrically connected to a second ground line GL2. The p+ contact region 1530 may provide a substrate bias voltage of the p-type semiconductor substrate 1100. Gates 1540 and 1542 of the third and fourth transistors ST1 and ST2 are electrically connected a source line SL0. Drains of the third and fourth transistors ST1 and ST2 may be formed as n+ contact regions 1532 and 1534, and the n+ contact regions 1532 and 1534 may be electrically connected to a bitline BL0 disposed in an outer area of the layout of the second region RG2.

Referring to FIG. 16, a cross-sectional view of FIG. 16 is substantially the same as the cross-sectional view of (b) of FIG. 15, except that sources of the third and fourth transistors ST1 and ST2 of the second ground switch 200b are formed as one p+ impurity region 1630 and do not form p+ contact regions. In this case, the sources of the third and fourth transistors ST1 and ST2 are biased by a bias of the semiconductor substrate 1100 or a p-well bias provided from an outer source of the memory cell array 110.

Figure 17:
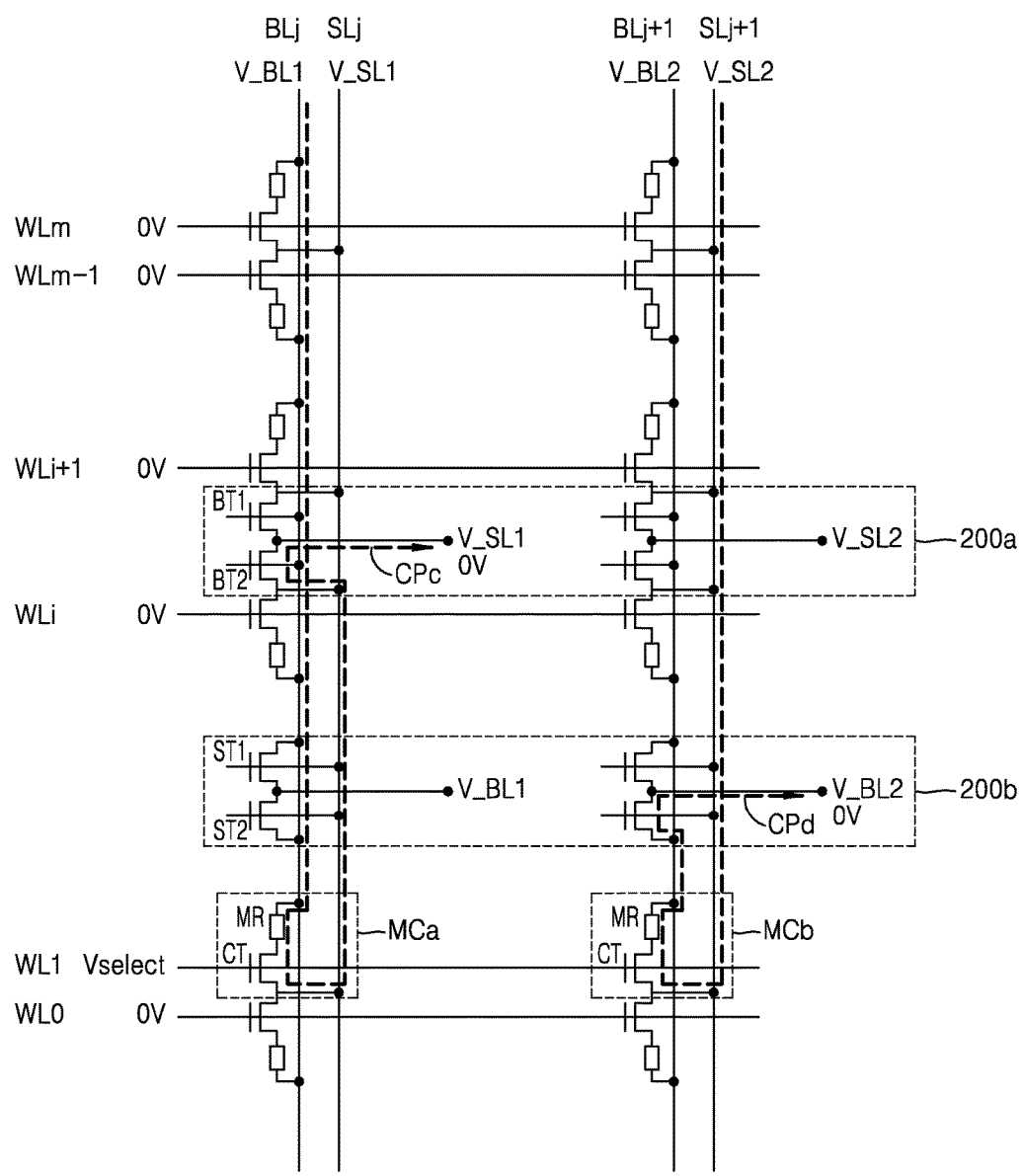
FIGS. 17 through 19 are diagrams illustrating example embodiments of memory cell arrays including ground switches.
Figure 18:
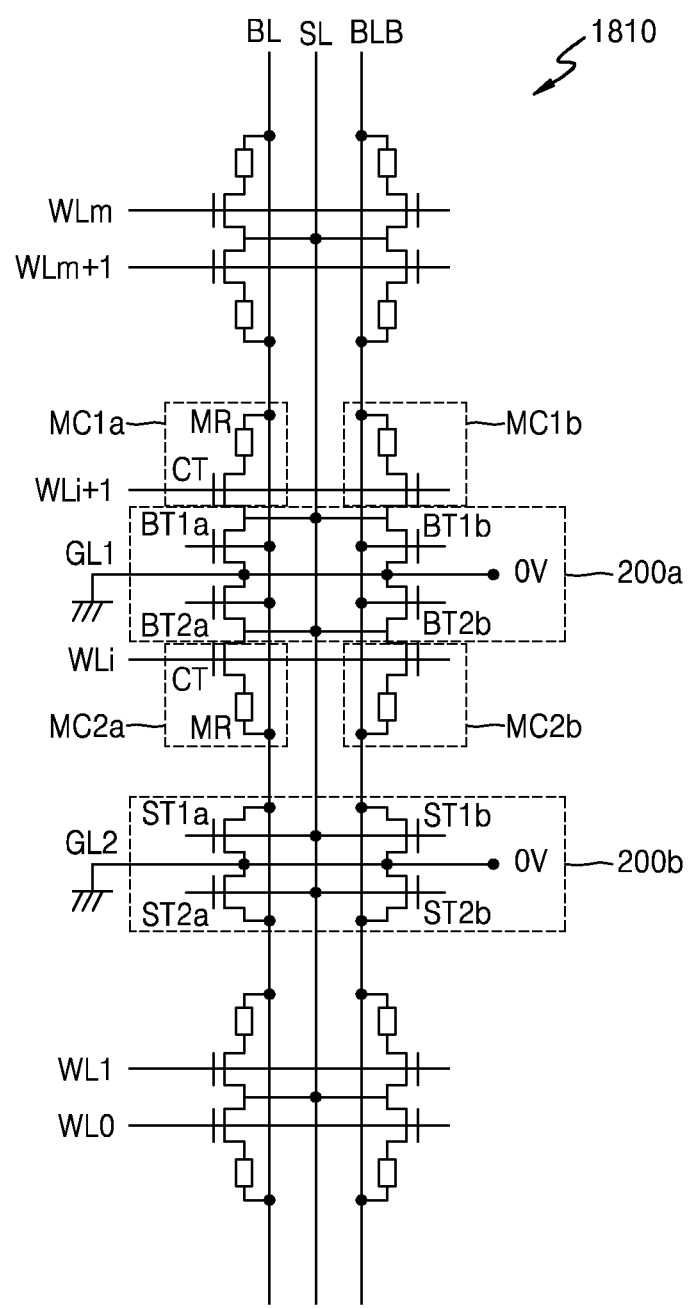
Figure 19:
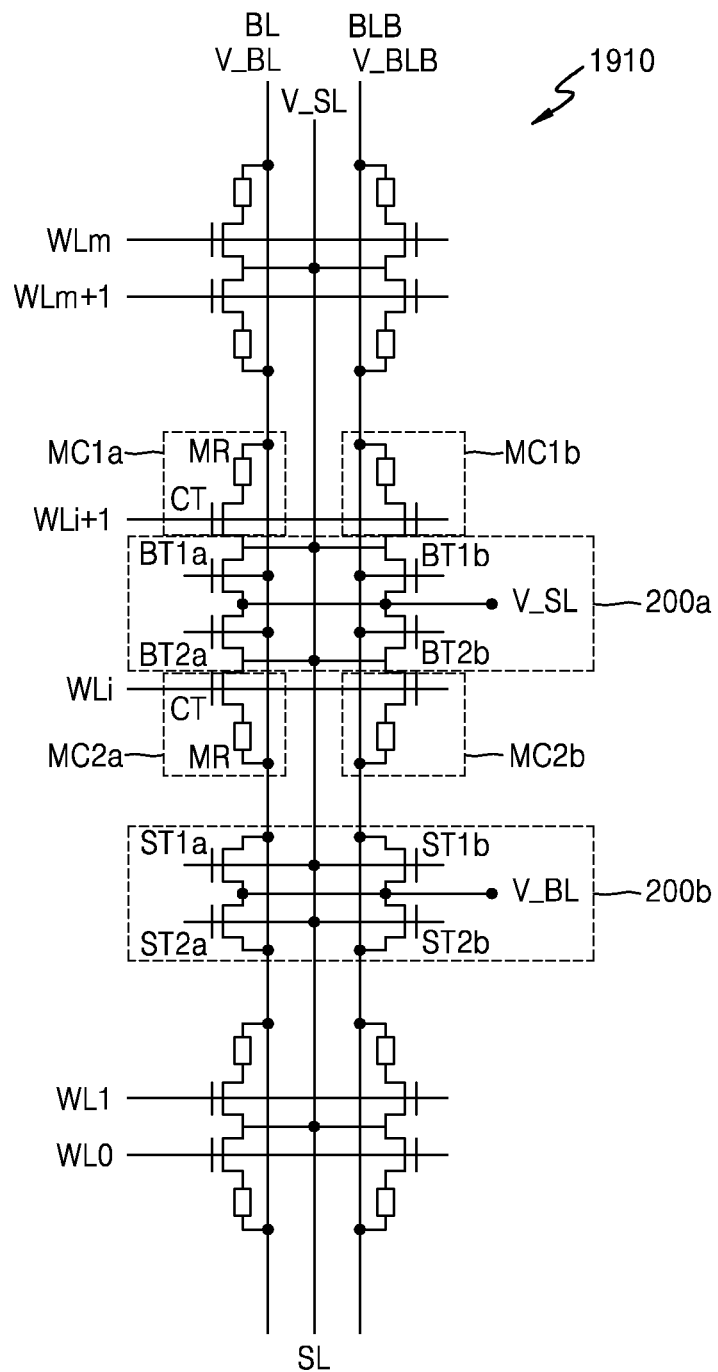

FIGS. 17 through 19 are diagrams illustrating memory cell arrays including ground switches, according to example embodiments.

Referring to FIG. 17, as a portion of a memory cell array 1710, FIG. 17 illustrates memory cells MCs and first and second ground switches 200a and 200b that are connected to bitlines (BLj and BLj+1) and source lines (SLj and SLj+1) that correspond to two columns from among a plurality of columns in the memory cell array 1710.

The memory cell array 1710 is substantially the same as the memory cell array 110 of FIG. 10, except that, in the memory cell array 1710, a voltage with a level equal or substantially equal to a voltage level V_SL that is applied to a source line SL is applied to sources of first and second transistors BT1 and BT2 of the first ground switch 200a, and a voltage with a level equal or substantially equal to a voltage level V_BL that is applied to a bitline BL is applied to sources of third and fourth transistors ST1 and ST2 of the second ground switch 200b.

During a data '0' write operation and read operation with respect to a memory cell MCa, a selection voltage Vselect is applied to a wordline WL1 to turn on a cell transistor CT of the memory cell MCa, a bitline voltage V_BL1 corresponding to a first write voltage is applied to the bitline BLj, and a source line voltage V_SL1 corresponding to a ground voltage GND is applied to the source line SLj.

The bitline voltage V_BL1 is applied to gates of the first and second transistors BT1 and BT2 of the first ground switch 200a, and the ground voltage GND is applied to sources of the first and second transistors BT1 and BT2, and thus, the first and second transistors BT1 and BT2 are turned on. Accordingly, a data '0' write and read current path CPc may be formed from the bitline BLj through the memory cell MCa, the source line SLj, and the second transistor BT2 of the first ground switch 200a to the source line voltage V_SL1 corresponding to the ground voltage GND.

During a data '1' write operation with respect to an memory cell MCb, the selection voltage Vselect is applied to the wordline WL1 to turn on the cell transistor CT of the memory cell MCa, a source line voltage V_SL2 corresponding to a second write voltage is applied to the source line SLj+1, and a bitline voltage V_BL2 corresponding to a ground voltage GND is applied to the bitline BLj+1. The source line voltage V_SL2 is applied to gates of third and fourth transistors ST1 and ST2 of the second ground switch 200b, and the ground voltage GND is applied to sources of the third and fourth transistors ST1 and ST2, and thus, the third and fourth transistors ST1 and ST2 are turned on.

Accordingly, a data '1' write current path CPd may be formed from the source line SLj+1 through the memory cell MCb, the bitline BLj+1, and the fourth transistor ST2 of the second ground switch 200b to the bitline voltage V_BL2 corresponding to the ground voltage GND.

Referring to FIG. 18, as a portion of a memory cell array 1810, FIG. 18 illustrates memory cells MCs and first and second ground switches 200a and 200b, which are connected to a bitline BL, a complementary bitline BLB, and a source line SL from among a plurality of rows included in the memory cell array 1810.

Each of the first ground switches 200a includes first and second transistors BT1a and BT2a, and third and fourth transistors BT1b and BT2b, wherein the first and second transistors BT1a and BT2a are connected between a first memory cell MC1a and a second memory cell MC2a that are connected to the bitline BL, and the third and fourth transistors BT1b and BT2b are connected between a third memory cell MC1b and a fourth memory cell MC2b that are connected to the complementary bitline BLB.

The first transistor BT1a is connected between a source of a cell transistor CT of the first memory cell MC1a and a first ground line GL1, and the second transistor BT2a is connected between a source of a cell transistor CT of the second memory cell MC2a and the first ground line GL1. Gates of the first and second transistors BT1a and BT2a are connected to the bitline BL.

The third transistor BT1b is connected between a source of a cell transistor CT of the third memory cell MC1b and the first ground line GL1, and the fourth transistor BT2b is connected between a source of a cell transistor CT of the fourth memory cell MC2b and the first ground line GL1. Gates of the third and fourth transistors BT1b and BT2b are connected to the complementary bitline BLB.

Each of the second ground switches 200b includes fifth and sixth transistors ST1a and ST2a, and seventh and eighth transistors ST1b and ST2b, wherein the fifth and sixth transistors ST1a and ST2a are connected between the bitline BL and a second ground line GL2, and the seventh and eighth transistors ST1b and ST2b are connected between the complementary bitline BLB and the second ground line GL2. Gates of the fifth through eighth transistors ST1a, ST2a, ST1b, and ST2b are connected to the source line SL.

Referring to FIG. 19, as a portion of a memory cell array 1910, FIG. 19 illustrates memory cells MC and first and second ground switches 200a and 200b, which are connected to a bitline BL, a complementary bitline BLB, and a source line SL from among a plurality of rows included in the memory cell array 1910.

The memory cell array 1910 is substantially the same as the memory cell array 1810 of FIG. 18, except that, in the memory cell array 1910, a voltage whose level is equal or substantially equal to a voltage level V_SL that is applied to the source line SL, not a first ground line GL1, is applied to sources of the first through fourth transistors BT1a, BT2a, BT1b, and BT2b of the first ground switch 200a, and a voltage whose level is equal or substantially equal to a voltage level V_BL that is applied to the bitline BL, not a second ground line GL2, is applied to sources of the fifth through eighth transistors ST1a, ST2a, ST1b, and ST2b of the second ground switch 200b.

Figure 20:
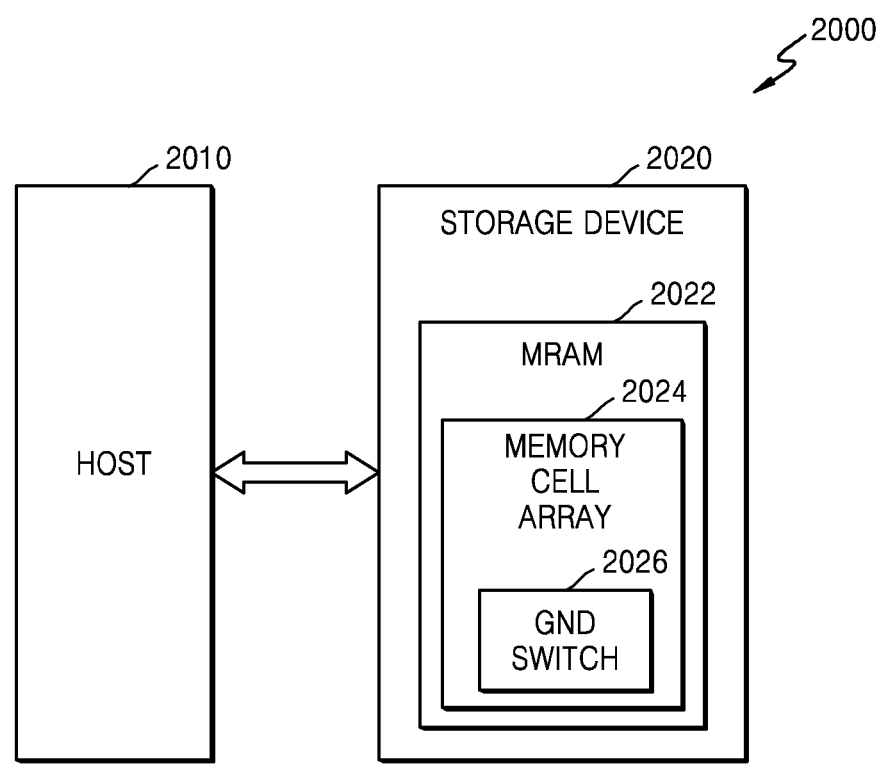
FIG. 20 is a diagram illustrating an electronic apparatus including a resistive memory device having a ground switch, according to an example embodiment.

FIG. 20 is a diagram illustrating an electronic apparatus 2000 including a resistive memory apparatus 2022 having a ground switch 2026, according to an example embodiment. The resistive memory apparatus 2022 may be a memory configured according to one or more example embodiments discussed herein.

Referring to FIG. 20, the electronic apparatus 2000 includes a host 2010 and a storage device 2020. The host 2010 may include a user device such as a personal/portable computer, a tablet personal computer (PC), a personal digital assistant (PDA), a portable medial player (PMP), a digital camera, a camcorder, or the like. The host 2010 stores data in the storage device 2020 or reads data from the storage device 2020, according to an I/O request.

The host 2010 may be connected to the storage device 2020 via at least one of various interfaces including a universal serial bus (USB), a multimedia card (MMC), peripheral component interconnection (PCI-E), advanced technology attachment (ATA), serial-ATA, parallel-ATA, a small computer small interface (SCSI), an enhanced small disk interface (ESDI), integrated drive electronics (IDE), and the like.

The storage device 2020 may include the resistive memory apparatus 2022 as a data storage for performing a write operation or a read operation according to an I/O request of the host 2010. As shown in FIG. 20, the resistive memory apparatus 2022 includes a memory cell array 2024, which further includes the ground switch 2026.

The memory cell array 2024 includes a plurality of memory cells arrayed in rows and columns, a plurality of wordlines corresponding to the rows, respectively, and a plurality of bitlines and source lines corresponding to the columns, respectively. The wordlines are respectively connected to gates of cell transistors of the memory cells, and the bitlines and the source lines are respectively connected to memory elements and sources of the cell transistors of the memory cells that are respectively positioned at the columns.

The ground switch 2026 includes a first transistor and a second transistor, wherein the first transistor is connected between a first ground line and a source of a cell transistor of a first memory cell from among the memory cells respectively positioned at the columns in the memory cell array 2024, and the second transistor is connected between a second ground line and each of the bitlines. A gate of the first transistor is connected to a bitline corresponding thereto, and a gate of the second transistor is connected to a source line corresponding thereto.

According to one or more example embodiments, the resistive memory apparatus 2022 decreases, by using the ground switch 2026, line resistances of the source line and the bitline during write and/or read operations with respect to the memory cell, and thus, reduces a cell resistance distribution due to a line resistance difference of the memory cells, so that a data sensing margin may be improved and/or ensured.

Figure 21:
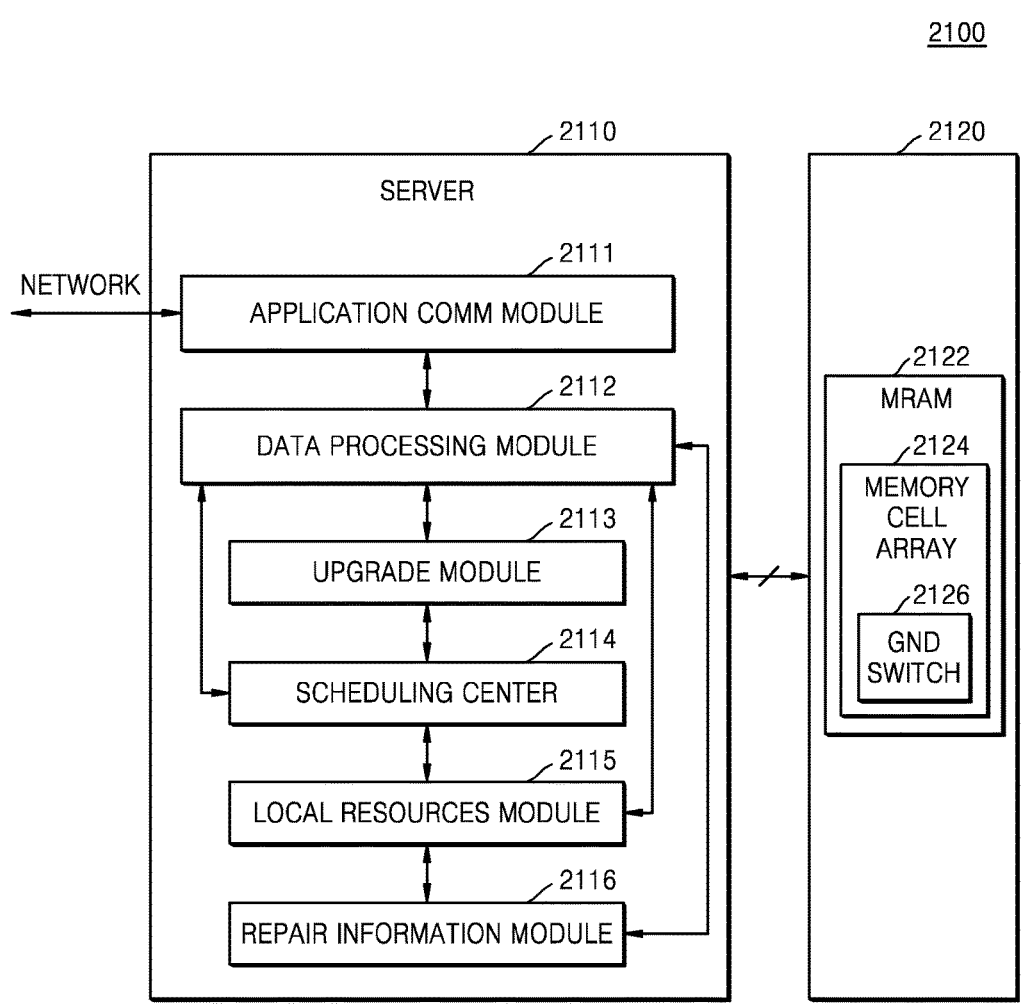
FIG. 21 is a diagram illustrating a server system including a resistive memory apparatus having a ground switch, according to an example embodiment.

FIG. 21 is a diagram illustrating a server system 2100 including a resistive memory apparatus 2122 having a ground switch 2126, according to an example embodiment.

Referring to FIG. 21, the server system 2100 includes a server 2110 and at least one storage device 2120 that stores data for operating the server 2110. The server 2110 includes an application communication module 2111, a data processing module 2112, an upgrade module 2113, a scheduling center 2114 (also referred to as a scheduling unit or scheduling module), a local resources module 2115, and a repair information module 2116. The application communication module 2111 allows the server 2110 to communicate with a computing system connected to a network, and/or to communicate with the storage device 2120. For example, the application communication module 2111 transmits, to the data processing module 2112, data and/or information that is provided via a user interface.

The data processing module 2112 is communicatively coupled to the local resources module 2115. The local resources module 2115 provides a list of repair shops/dealers/technical information based on data or information connected to the server 2110. The upgrade module 2113 interfaces with the data processing module 2112. The upgrade module 2113 upgrades firmware, a reset code, a diagnostic system, or other information of appliances according to data or information transmitted from the storage device 2120.

The scheduling center 2114 allows a real-time option to a user, according to data or information input to the server 2110. The repair information module 2116 interfaces with the data processing module 2112. The repair information module 2116 is used to provide repair-related information (e.g., an audio, a video, a document file, etc.) to a user. The data processing module 2112 packages information based on information transmitted from the storage device 2120. Afterwards, the information is transmitted to the storage device 2120 and/or is displayed to the user. The storage device 2120 may include the resistive memory apparatus 2122 as a data storage unit.

The resistive memory apparatus 2122 includes a memory cell array 2124, which further includes the ground switch 2126. The memory cell array 2124 may be configured in accordance with one or more example embodiments discussed herein.

For example, the memory cell array 2124 includes a plurality of memory cells arrayed in rows and columns, a plurality of wordlines corresponding to the rows, respectively, and a plurality of bitlines and source lines corresponding to the columns, respectively. The wordlines are respectively connected to gates of cell transistors of the memory cells, and the bitlines and the source lines are respectively connected to memory devices and sources of the cell transistors of the memory cells that are respectively positioned at the columns.

The ground switch 2126 includes a first transistor and a second transistor, wherein the first transistor is connected between a first ground line and a source of a cell transistor of a first memory cell from among the memory cells respectively positioned at the columns in the memory cell array 2124, and the second transistor is connected between a second ground line and each of the bitlines. A gate of the first transistor is connected to a bitline corresponding thereto, and a gate of the second transistor is connected to a source line corresponding thereto.

According to one or more example embodiments, the resistive memory apparatus 2122 decreases, by using the ground switch 2126, line resistances of the source line and the bitline during write/read operations with respect to the memory cell, and thus, reduces a cell resistance distribution due to a line resistance difference of the memory cells, so that a data sensing margin may be improved and/or ensured.

While inventive concepts have been particularly shown and described with reference to example embodiments thereof, it will be understood that various changes in form and details may be made therein without departing from the spirit and scope of the following claims.

What is claimed is:

1. A memory apparatus comprising:
   a plurality of memory cells arrayed in a plurality of rows and a plurality of columns, each of the plurality of memory cells including a cell transistor and a memory element;
   a plurality of bitlines, each of the plurality of bitlines connected to memory elements of memory cells in a corresponding column of memory cells;
   a plurality of source lines, each of the plurality of source lines connected to sources of cell transistors of memory cells in a corresponding column of memory cells;
   at least one first ground switch including a first transistor connected between a first ground line and a source of a cell transistor of a first memory cell from among memory cells in a first of the plurality of columns, a gate of the first transistor connected to a first of the plurality of bitlines; and
   at least one second ground switch including a second transistor connected between a second ground line and the first of the plurality of bitlines, a gate of the second transistor connected to a first of the plurality of source lines; wherein
   the at least one first ground switch further includes a third transistor adjacent to the first transistor, the third transistor and the first transistor commonly connected to the first ground line,
   the third transistor is connected between the first ground line and a source of a cell transistor of a second memory cell from among the memory cells in the first of the plurality of columns, and
   a gate of the third transistor is connected to the first of the plurality of bitlines.

2. The memory apparatus of claim 1, wherein the first ground line and the second ground line are a common ground line.

3. The memory apparatus of claim 1, wherein the memory element comprises:
   a magnetic tunnel junction (MTJ) having a magnetoresistive element.

4. A memory apparatus comprising:
   a plurality of memory cells arrayed in a plurality of rows and a plurality of columns, each of the plurality of memory cells including a cell transistor and a memory element;
   a plurality of bitlines, each of the plurality of bitlines connected to memory elements of memory cells in a corresponding column of memory cells;
   a plurality of source lines, each of the plurality of source lines connected to sources of cell transistors of memory cells in a corresponding column of memory cells;
   at least one first ground switch including a first transistor connected between a first ground line and a source of a cell transistor of a first memory cell from among memory cells in a first of the plurality of columns, a gate of the first transistor connected to a first of the plurality of bitlines; and at least one second ground switch including a second transistor connected between a second ground line and the first of the plurality of bitlines, a gate of the second transistor connected to a first of the plurality of source lines; wherein the at least one second ground switch further includes a third transistor adjacent to the second transistor, the third transistor and the second transistor commonly connected to the second ground line, the third transistor is connected between the second ground line and the first of the plurality of bitlines, and a gate of the third transistor is connected to the first of the plurality of source lines.

5. The memory apparatus of claim 4, wherein sources of the second and third transistors connected to the second ground line are impurity regions separated by an isolation region.

6. The memory apparatus of claim 4, wherein sources of the second and third transistors connected to the second ground line are formed as one impurity region.

7. The memory apparatus of claim 4, wherein a width of the gate of each of the second and third transistors is substantially the same as a width of a gate of the cell transistor of the first memory cell; and a length of the gates of each of the second and third transistors is substantially the same as a length of the gate of the cell transistor of the first memory cell.

8. A memory apparatus comprising:

a plurality of memory cells arrayed in a plurality of rows and a plurality of columns, each of the plurality of memory cells including a cell transistor and a memory element;

a plurality of bitlines, each of the plurality of bitlines connected to memory elements of memory cells in a corresponding column of memory cells;

a plurality of source lines, each of the plurality of source lines connected to sources of cell transistors of memory cells in a corresponding column of memory cells;

at least one first ground switch including a first transistor connected between a first ground line and a source of a cell transistor of a first memory cell from among memory cells in a first of the plurality of columns, a gate of the first transistor connected to a first of the plurality of bitlines;

at least one second ground switch including a second transistor connected between a second ground line and the first of the plurality of bitlines, a gate of the second transistor connected to a first of the plurality of source lines;

a plurality of complementary bitlines, each of the plurality of complementary bitlines paired with a corresponding one of the plurality of bitlines;

a second memory cell corresponding to the first memory cell, the second memory cell connected to a first of the plurality of complementary bitlines, the first of the plurality of complementary bitlines corresponding to the first of the plurality of bitlines; and wherein the at least one first ground switch further includes a third transistor connected between the first ground line and a source of a cell transistor of the second memory cell, wherein a gate of the third transistor is connected to the first of the plurality of complementary bitlines.

9. The memory apparatus of claim 8, wherein the at least one second ground switch further comprises:

a fourth transistor connected between the second ground line and the first of the plurality of complementary bitlines; wherein a gate of the fourth transistor is connected to the first of the plurality of source lines.

* * * * *